(12) United States Patent
Rosenauer et al.

(10) Patent No.: US 10,374,320 B2
(45) Date of Patent: Aug. 6, 2019

(54) ELECTROMAGNETIC SIGNAL FOCUSING STRUCTURES

(71) Applicant: Keyssa Systems, Inc., Campbell, CA (US)

(72) Inventors: Dennis F. Rosenauer, Tigard, OR (US); Giriraj Mantrawadi, Tigard, OR (US)

(73) Assignee: KEYSSA SYSTEMS, INC., Campbell, CA (US)

( * ) Notice: Subject to any disclaimer, the term of this patent is extended or adjusted under 35 U.S.C. 154(b) by 408 days.

(21) Appl. No.: 15/206,583

(22) Filed: Jul. 11, 2016

(65) Prior Publication Data

US 2018/0013205 A1    Jan. 11, 2018

(51) Int. Cl.
*H01Q 1/22* (2006.01)
*H01Q 1/48* (2006.01)
*H01Q 15/16* (2006.01)

(52) U.S. Cl.
CPC .......... *H01Q 15/16* (2013.01); *H01Q 1/2283* (2013.01); *H01Q 1/48* (2013.01); *H01L 2224/48091* (2013.01); *H01L 2924/181* (2013.01)

(58) Field of Classification Search
CPC ........ H01Q 15/02; H01Q 15/04; H01Q 15/06; H01Q 15/08; H01Q 15/10; H01Q 15/12; H01L 23/66; H01P 5/107

USPC ................. 343/753, 754, 755, 909
See application file for complete search history.

(56) References Cited

U.S. PATENT DOCUMENTS

| 9,136,230 B2 * | 9/2015 | Demin ..................... H01P 5/107 |
| 2013/0257670 A1 | 10/2013 | Sovero et al. |
| 2013/0271331 A1 * | 10/2013 | Redd .................... H01Q 19/062 343/753 |
| 2015/0111496 A1 * | 4/2015 | McCormack ........ H04B 5/0031 455/41.1 |
| 2015/0346334 A1 * | 12/2015 | Nagaishi ................. G01S 13/60 342/115 |

FOREIGN PATENT DOCUMENTS

EP        2843758 A1 *   3/2015   ............. H01P 5/107

\* cited by examiner

*Primary Examiner* — Daniel Munoz
(74) *Attorney, Agent, or Firm* — Van Court & Aldridge LLP

(57) ABSTRACT

Embodiments discussed herein refer to systems and structures for focusing dispersal of electromagnetic signals. Focusing of the electromagnetic signals is achieved by a reflective lens that is constructed from several extremely high frequency focusing layers. Each focusing layer can include an extremely high frequency focusing window that, collectively, define the geometry of a cavity backed reflective lens and its ability to focus electromagnetic signal dispersion.

18 Claims, 19 Drawing Sheets

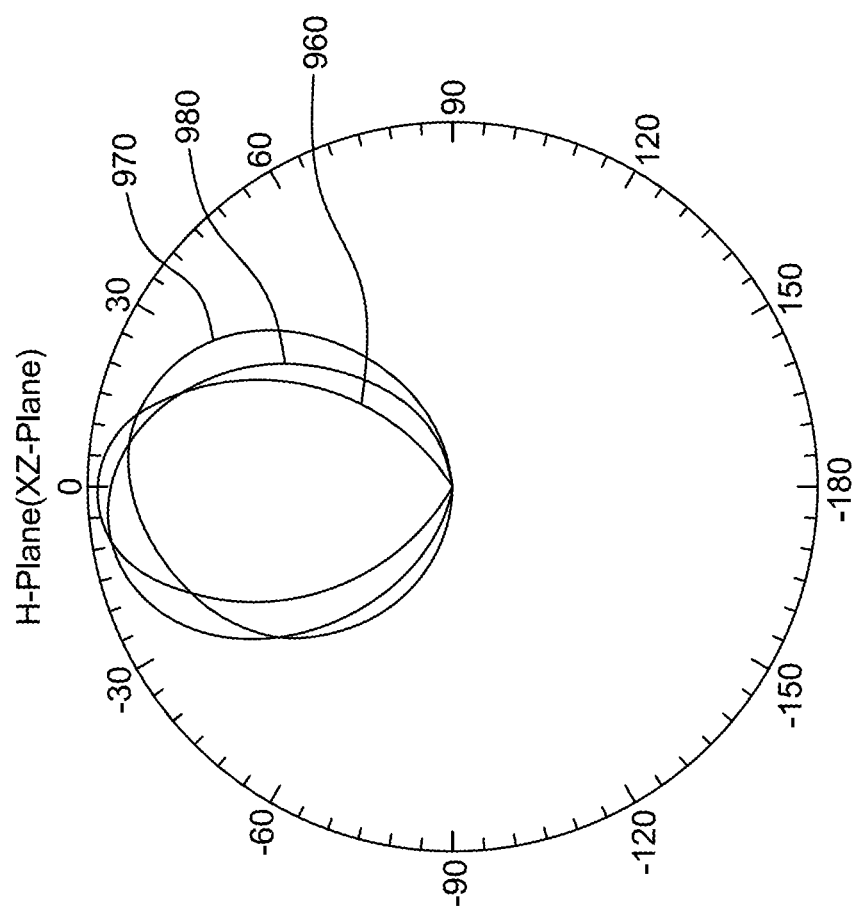

ELECTROMAGNETIC SIGNAL FOCUSING STRUCTURES

FIELD OF THE INVENTION

The present disclosure relates to extremely high frequency ("EHF") systems and methods for the use thereof, and more particularly to systems and methods to focusing dispersal of electromagnetic signals.

BACKGROUND

Electronic devices can be "connected" together to enable data transfer between the devices. Typically, the connection between the two devices can be a cabled connection or a wireless connection. A cabled connection such as Universal Serial Bus (USB) is typically point-to-point, and requires mechanical connectors at each device, and a cable between the devices. A wireless connection such as WiFi or Bluetooth can operate in a "broadcast" mode, where one device can communicate simultaneously with several other devices, over a radio frequency (RE) link, typically in the range of 700 MHz-5.8 GHz.

Contactless connectors represent a different type of connector, compared to conventional cabled and wireless connectors, for transferring data between devices. Contactless connectors can be used for point-to-point contactless data communication between two devices and do not require a mechanical coupling to enable data transfer. The contactless connectors of both devices merely need to be placed in close enough proximity to each other to enable contactless data transfer. Contactless data transfer is performed when contactless signals are transmitted from one device and received by a counterpart device. Since the contactless communications link between the two devices depends on transmission of contactless signals, there is potential for mitigating factors that affect the efficiency of the contactless signals. Accordingly, what are needed are systems and structures that focus dispersal of contactless signals to combat those mitigating factors.

BRIEF SUMMARY

Embodiments discussed herein refer to systems and structures for focusing dispersal of electromagnetic signals. Focusing of the electromagnetic signals is achieved by hybridizing a cavity backed antenna and a geometrically shaped reflector through use of several extremely high frequency focusing layers. Each focusing layer can include an extremely high frequency focusing window that, collectively with the other focusing layers, define the geometry of a cavity backed reflective lens and its ability to focus electromagnetic signal dispersion.

In one embodiment, a system is provided that includes a multi-layer substrate comprising a plurality of EHF focusing layers that collectively form a cavity backed reflective lens characterized as having a cavity that enhances constructive interference of electromagnetic (EM) signal energy being re-radiated by the cavity backed reflective lens and narrows a shape of the EM signal being directed away from the cavity backed reflective lens. The system includes a contactless communication unit (CCU) comprising control circuitry and an antenna, wherein the antenna is positioned with respect to the cavity backed reflective lens, and wherein during operation of the CCU, an electromagnetic signal pattern being emitted from or received by the antenna is shaped by the cavity backed reflective lens.

In another embodiment, a module for controlling contactless communications with a counterpart communications unit is provided. The module can include contactless communications circuitry comprising silicon die and an insulation layer encompassing the silicon die, the circuitry comprising a first surface, an antenna that is electrically coupled to the contactless communications circuitry, and an EM focusing structure secured to the first surface, the EM focusing structure comprising a plurality of EHF focusing layers that collectively form a cavity backed reflective lens, wherein the silicon die serves as a nominal reflective ground plane for the EM focusing structure.

In yet another embodiment, an EM reflective lens for use in focusing EM signal energy being emitted by or received by an antenna for contactless communications is provided. The EM reflective lens includes a nominal reflecting ground plane, a first EHF focusing layer positioned on top of the nominal reflecting ground plane, the first EHF focusing layer comprising a first EHF focusing window, a second EHF focusing layer positioned on top of the first EHF focusing layer, the second EHF focusing layer comprising a second EHF focusing window, a third EHF focusing layer positioned on top of the second EHF focusing layer, the third EHF focusing layer comprising a third EHF focusing window, and wherein the first, second, and third EHF focusing windows define a cavity backed reflective lens characterized as having a cavity shaped as a paraboloid.

In yet another embodiment, a device can include a multilayer board comprising a plurality of EHF focusing layers embedded within the multilayer board, wherein the plurality of EHF focusing layers are arranged with respect to each other to provide a beam steering cavity backed reflective lens, and a transducer positioned with respect to the beam steering cavity backed reflective lens, wherein the position of the transducer and the arrangement of the EHF focusing layers steer an electromagnetic (EM) signal energy being re-radiated by the beam steering cavity backed reflective lens along an axis that is oblique to a center axis that is perpendicular to the multilayer board.

A further understanding of the nature and advantages of the embodiments discussed herein may be realized by reference to the remaining portions of the specification and the drawings.

BRIEF DESCRIPTION OF THE DRAWINGS

FIG. 9B shows an illustrative RF signal radiation pattern emanating in the XZ plane of reflective lens 720, according to an embodiment;

DETAILED DESCRIPTION

Figure 1:
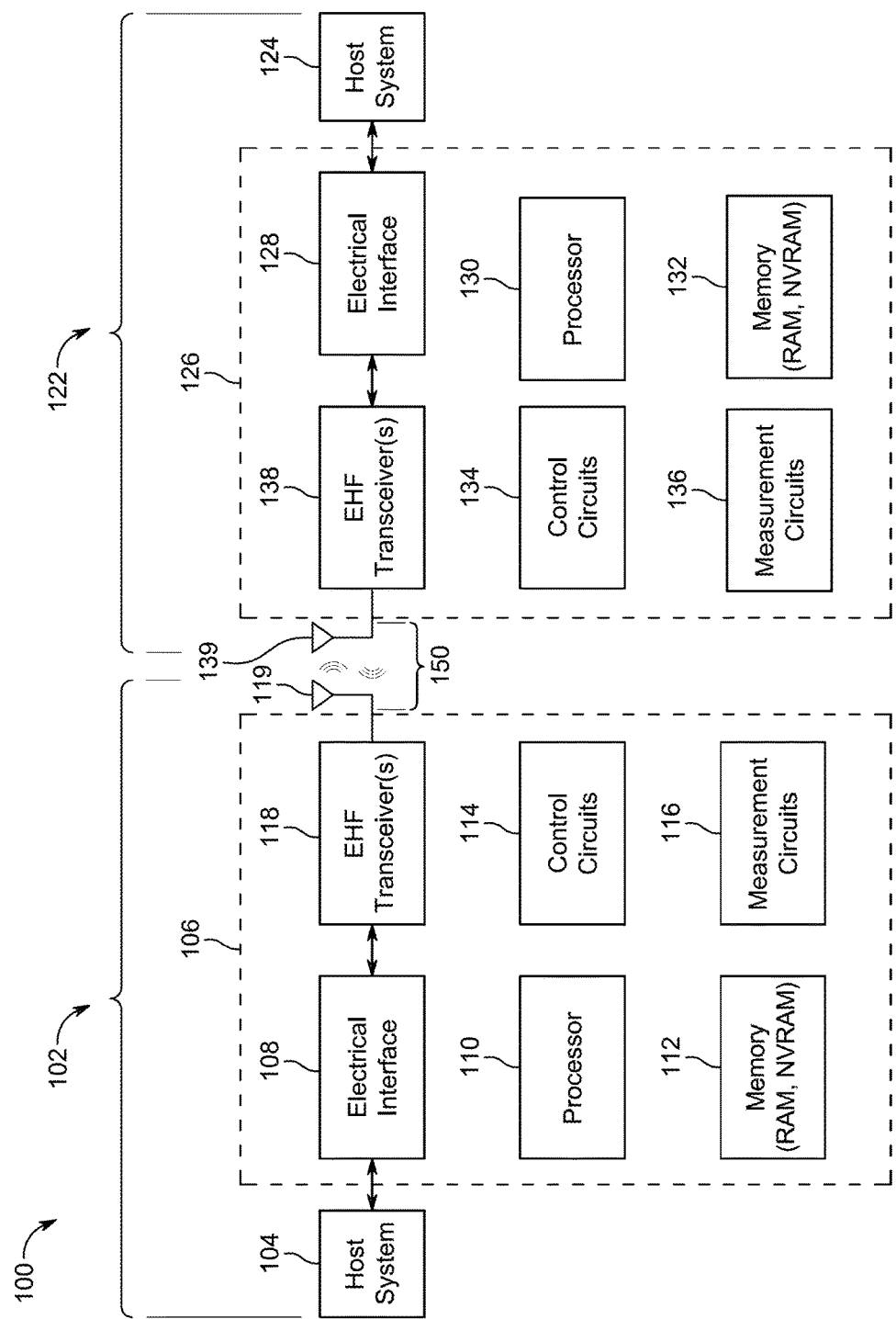
FIG. 1 illustrates a communications system, according to an embodiment.

Illustrative embodiments are now described more fully hereinafter with reference to the accompanying drawings, in which representative examples are shown. Indeed, the disclosed communication systems and methods may be embodied in many different forms and should not be construed as limited to the embodiments set forth herein. Like numbers refer to like elements throughout.

In the following detailed description, for purposes of explanation, numerous specific details are set forth to provide a thorough understanding of the various embodiments. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

In today's society and ubiquitous computing environment, high-bandwidth modular and portable electronic devices are being used increasingly. Security and stability of communication between and within these devices is important to their operation. In order to provide improved secure high-bandwidth communications, the unique capabilities of wireless communication between electronic devices and between sub-circuits within each device may be utilized in innovative and useful arrangements.

Such communication may occur between radio frequency communication units, and communication at very close distances may be achieved using EHF frequencies (typically, 30-300 GHz) in an EHF communication unit. An example of an EHF communications unit is an EHF comm-link chip. Throughout this disclosure, the terms comm-link chip, and comm-link chip package are used to refer to EHF antennas embedded in IC packages. Comm-link chips are an example of a communication device, also referred to as contactless communication unit, a contactless communications transceiver unit (CCTU or EHF XCVR).

The term "transceiver" may refer to a device such as an integrated circuit ("IC") including a transmitter (Tx) and a receiver (Rx) so that the integrated circuit may be used to both transmit and receive information, such as data. Such a transceiver may be referred to herein as a CCU or an EHF XCVR. Generally, a transceiver may be operable in a half-duplex mode (alternating between transmitting and receiving), a full-duplex mode (transmitting and receiving simultaneously), or configured as either a transmitter or a receiver. A transceiver may include separate integrated circuits for transmit and receive functions. The terms "contactless," "coupled pair," and "close proximity coupling" as used herein, refer to the implementing electromagnetic (EM) rather than electrical (wired, contact-based) connections and transport of signals between entities (such as devices). As used herein, the term "contactless" may refer to a carrier-assisted, dielectric coupling system. The connection may be validated by proximity of one device to a second device. Multiple contactless transmitters and receivers may occupy a small space. A contactless link established with electromagnetics may be point-to point in contrast with a wireless link which typically broadcasts to several points.

The RF energy output by the EHF XCVRs described herein may be designed to adhere to various requirements mandated by one or more governments or their agencies. For example, the FCC may promulgate requirements for certification for transmitting data in a RF frequency band.

"Standards" and related terms such as "Standards-based", "Standards-based interfaces", "Standards-based protocol", "interface protocols," and the like may refer to legacy interface standards which may include but are not limited to USB (e.g., USB 2, USB 3, USB 3/2, or USB OTG), DisplayPort (DP), Thunderbolt, HDMI, SATA/SAS, PCIe, Ethernet SGMII, Hypertransport, Quickpath, I2S, GPIO, I2C and their extensions or revisions. For example, the term "interface protocol" may refer to the protocol being used by one system to communicate with another system. As a specific example, the interface protocol being used by a system may be a USB interface protocol; as such, the system may communicate according to the rules governing USB communications.

When transferring data between EHF communication units, the transfer speed and quality are optimal when an Rx is placed in the signal path where the Tx radiates maximum signal strength. Thus, higher data transfer efficiency is realized when the Rx and Tx are properly aligned with respect to each other. In addition, use of the reflective lens according to embodiments discussed herein can further increase the efficiency of data transfer by focusing dispersal of the EM signaler energy.

FIG. 1 illustrates a communications system 100, wherein two electronic device subsystems or devices 102 and 122 may communicate with one another over at least one contactless communications link 150. Data may be transferred in at least one direction, from first device 102, which may be regarded as a "source" for sending the data to be transferred, to second device 122, which may be regarded as a "destination" for receiving the data to be transferred. With reference to FIG. 1, the transfer of data from first device 102 to second device 122 may be described. However, it should be understood that data may alternatively or additionally be transferred from second device 122 (e.g., acting as a "source" for sending the data) to first device 102 (e.g., acting as a "destination" for receiving the data), and that information may also be exchanged in both directions between devices 102 and 122 during a given communications session.

For illustrative clarity, devices 102 and 122 will be described as "mirror images" of one another, but it should be understood that the two devices 102 and 122 may be different than each other. For example, one of the devices may be a laptop computer or surface computer and the other device may be a mobile telephone or other portable device. Some examples of electronic devices which may benefit from the techniques disclosed herein may include cellular telephones (or handsets, or smart phones), computers, docks (e.g., docking stations), laptops, tablets, or comparable electronic devices, to name but a few.

First electronic device 102 may include a host system 104 and a contactless communication unit 106, which may be referred to as an "EHF contactless communication unit", a "smart" contactless connector, a "communication subsystem", a "smart connector", a "contactless connector", or simply a "connector" 106. The unit 106 associated with first device 102 may be generally capable of performing at least one of establishing and managing operation of contactless link 150 with unit 126 of second device 122, monitoring and modifying data passing through unit 106 onto link 150, and/or interfacing with and providing application support for host system 104. These functions of unit 106, with regard to interacting with link 150, the data, and host system 104, may be described and elaborated upon and discussed in greater detail in this disclosure.

Unit 106 associated with first device 102 may include some or all of the following elements: electrical interface 108, processor 110 and associated memory 112, control circuits 114, measurement circuits 116, one or more transceivers 118, and/or one or more transducers 119. The operation of these various elements (108-119) may be described and elaborated upon and discussed in greater detail in this disclosure.

Second electronic device 122 may include host system 124 and a contactless communication unit 126, which may be referred to as an "EHF contactless communication unit", a "smart" contactless connector, a "communication subsystem", a "smart connector", a "contactless connector", or simply a "connector" 126. Connector 126 associated with second device 122 may be generally capable of establishing and managing operation of contactless link 150 with unit 106 of first device 102, monitoring and modifying data passing though the unit 126 onto link 150, and/or interfacing with and/or providing application support for host system 124. These functions of unit 126, with regard to interacting with link 150, the data, and the host system 124, may be described and elaborated upon and discussed in greater detail in this disclosure.

Unit 126 associated with second device 122 may include some or all of the following elements: an electrical interface 128, processor 130 and associated memory 132, control circuits 134, measurement circuits 136, one or more transceivers 138, and/or one or more transducers 139. The operation of these various elements (128-139) may be described and elaborated upon and discussed in greater detail in this disclosure.

Units 106 and 126 may operate without intervention from host processors (e.g., processors of host systems 104 and 124, respectively), and/or may take control of the host systems 104 and 124, respectively, or portions thereof. Units 106 and 126 may open/activate applications, return status/power levels, connection parameters, data types, information on devices/systems that are connected, content information, amount and type of data being transferred, including device configuration based on connection type, link management, quota information, channel control, and the like.

The dashed-line rectangles shown (e.g., in FIG. 1) around units 106 and 126 may simply represent "partitioning" of functions, separating (e.g., distinguishing) units 106 and 126 from host system 104 and 124, respectively. The antennae shown (e.g., symbolically as transducers 119 and 139) outside of the dashed-line rectangles may be considered to be within the functional blocks of units 106 and 126, but may be disposed either internal or external to a communications chip constituting the contactless connector (e.g., for receiving EHF contactless signals from another antennae/transducer (e.g., across link 150)). The dashed-line rectangles shown (e.g., in FIG. 1) around units 106 and 126 may also represent non-conducting barriers (e.g., housings, enclosures, or the like, not shown), such as plastic or acrylic enclosures for units 106 and 126 or could also include entire devices 102 and 122, respectively, as described hereinabove.

Electrical interfaces 108 and 128 may include communications port(s)/channel(s) to communicate with any suitable portion(s) of host systems 104 and 124, respectively. Host systems 104 and 124 may have their own processors and associated circuitry (e.g., as described below with respect to FIG. 2 but not shown in FIG. 1). As mentioned, devices 102 and 122 may be described as "mirror images" of one another, but it should be understood that the two devices 102 and 122, and/or the two host systems 104 and 124, may be different than each other. For example, one of the devices or host systems may be a laptop computer, the other device or host system may be a mobile telephone or an adapter for a mobile telephone. Some examples of electronic devices which may benefit from the techniques disclosed herein may include cellular telephones (or handsets, or smart phones), computers, docks (e.g., docking stations), laptops, tablets, or comparable electronic devices, to name but a few.

Processors 110 and 130 may be embedded microprocessors, or microcontrollers, or state machines, may run management operating systems (OSs) for the connection, and/or may have built-in authentication/encryption engines. Processors 110 and 130, either alone or in combination with other elements presented herein, may be operative to manage the communications link, to monitor data passing through the units and over the communications link, and/or to provide application support for a host system, or to execute one or more state machines, or variations thereof as may become evident from the several functional descriptions set forth herein. In a broader sense, units 106 and 126 may be capable of performing one of more of (at least one of) the various functions described herein.

Memory 112 and 132 may be any suitable memory, such as random access memory (RAM), non-volatile RAM (NVRAM, such as flash memory), or the like, and may include registers containing configuration, status, permissions, content permissions, keys for authentication/encryption, application(s) (e.g., software and/or firmware for use by processor 110 and 130), and the like.

Control circuits 114 and 134 may include any suitable circuitry that may be capable of monitoring the state of the link and/or actively appending to or changing data concurrently ("on-the-fly") as it goes through unit 106 or 126, respectively.

Measurement circuits 116 and 136 may include any suitable circuitry that may be capable of observing (e.g., monitoring) the connection state/status, the connection type, and/or the data being transmitted. Sensors (not shown) may be included to monitor signal strength, ambient environmental conditions, and the like. Signal-to-noise ratio can be used as an indicator of signal quality.

Transceivers 118 and 138 may include any transceivers (and associated transducers or antennas 119 and 139) that may be suitable for converting between electrical signals (e.g., for the host system) and EM signals (e.g., for the contactless communications link). Transceivers 118 and 138 may each be a half-duplex transceiver that can asynchronously convert a baseband signal into a modulated EHF carrier, which may be radiated from an internal or external antenna (e.g., as shown schematically), or can receive and demodulate the carrier and reproduce the original baseband signal. The EHF carrier may penetrate a wide variety of commonly-used non-conductive materials (e.g., glass, plastic, etc.).

It should be understood that if only one-way communication is required, such as from first device 102 to second device 122, transceiver 118 could be replaced by a Tx and transceiver 138 could be replaced by a Rx.

Transmit power and receive sensitivity for transceivers 118 and 138 may be controlled to minimize electromagnetic interference (EMI) effects and/or to simplify FCC certification, if appropriate.

Transceivers 118 and 138 may be implemented as IC chips comprising a Tx, a Rx, and related components. Transceiver chip(s) may be packaged in a conventional manner, such as in ball grid array (BGA) format. The antenna may be integrated into the package, or may be external to the package, or may be incorporated onto the chip itself. An exemplary unit 106, 126 may include one, two, or more transceiver chips. Some features or characteristics of transceivers 118 and 138 may include low latency signal path, multi-gigabit data rates, link detection, and/or link training. The signals transmitted by transceivers 118 and 138 may be modulated in any suitable manner to convey the data being transferred from one device to the other device, some non-limiting examples of which are presented herein. Modulation may be OOK (on/off keying), ASK, PSK, QPSK, QAM, or other suitable modulation techniques. Signals may be encoded and packetized and transmitted by one transceiver (e.g., transceiver 118), and received and unpacketized and decoded by another transceiver (e.g., transceiver 138). Out-of-band signaling or other suitable techniques may be used to convey information other than or related to the data being transferred between the two devices.

Transceivers 118 and 138, or individual transmitters and receivers, which may be implemented as chips, may be factory-serialized, so that the chips and their transmissions may be 'tagged' (e.g., fingerprinted), which may enable a later forensic analysis to be performed for digital rights management. For example, protected (e.g., premium) content could be freely (e.g., unimpededly) transferred from one device to another, but the transaction could be traced to the specific devices involved, so that the participants in the transaction can be held accountable (e.g., billed). Premium protected content may be modified, data appended thereto, and/or can be logged with chip ID, user ID, or by other means.

Communications link 150 may be a "contactless" link, and the first and second units 106 and 126 may be "contactless" connectors, as described herein. Differences between units 106 and 126 disclosed herein and conventional mechanical connectors may be immediately apparent, and may be described herein. The units may be considered to be communication subsystems of a host device. In this regard, differences between the contactless connectors 106 and 126 disclosed herein and controllers such as Standards controllers, including Ethernet, may not be immediately apparent in that both may handle data flow between a host system and a communications link. However, a distinction between the contactless connectors disclosed herein and exemplary Standards controllers may be that the contactless connectors disclosed herein may both set up the contactless communications link and transfer data from a host system directly onto the contactless communications link, without the intermediary, for example, of mechanical (e.g., electrical, not RF) connectors and a cable. Further distinctions may be made in the way that the contactless connectors disclosed herein may be capable of operating independently and/or transparently from the host system, without requiring host awareness or interaction.

Data transfer between electronic devices 102 and 122 may be implemented over a "contactless" RF EM communications link 150, which may be handled substantially entirely by the units 106 and 126 of first and second devices 102 and 122, respectively. Signals flowing between units 106 and 126 of devices 102 and 122 may occur electromagnetically over a non-electrical (e.g., dielectric) medium, such as an air gap, waveguide, plastics (e.g., polyethylene, thermoplastic polymers, polyvinylidene difluoride, fluoropolymers, ABS, and other plastics), including combinations of these materials. The EHF signal can pass through other dielectric materials such as cardboard. The EHF signal can pass through a series of different dielectric materials and/or waveguides. Alternatively, the signals may pass by way of a slot antenna in a conductive medium, where the slot antenna may direct the contactless connectivity in a desired direction. A device (e.g., at least the contactless connector) may be substantially fully enclosed by a conductive medium other than at a location where it may be desired to emit and/or receive EHF radiation from a partner device (e.g., at least the contactless connector thereof), which may also be similarly substantially fully enclosed by a conductive medium.

Due to the high data rate enabled by the EHF contactless communication, large data files, such as movies, audio, device images, operating systems, and the like may be transferred in very short periods of time in contrast with existing technologies such as NFC. As an example, a 1 Gigabyte data file may be transferred in as little as 2 seconds. The electromagnetic communication may typically be over an air gap that may be limited to a short range, such as, for example, 0-5 cm. A dielectric medium, such as a dielectric coupler, may be used to extend the range of the contactless link between the devices 102 and 122 to several centimeters, meters, or more.

It should be understood that in this, and any other embodiments of contactless links discussed herein, an overall communications system may be implemented as a combination of contactless and physical links. Furthermore, some of the techniques described herein may be applied to transferring data over a physical link. In such a link the transceiver can contactlessly transmit data to a cable that may serve as a physical conduit for the data.

One or both of devices 102 and 122 may have two or more transceivers. Having two or more transceivers may support a feedback loop, full duplex operation, and/or may simultaneously establish a second communications link (e.g., for communicating with the host system). An exemplary "data flow" may proceed as follows: data originating from host system 104 or data originating at unit 106 may be provided by unit 106, via its transceiver 118 and transducer 119, onto the communications link 150. The data may pass through or over communications link 150. Data received from the communications link 150 by transducer 139 and transceiver 138 of unit 126 may be provided to host system 124 or may remain with unit 126. Data may flow in the reverse direction, from host system 124 via unit 126 or originating at unit 126 onto the contactless link 150 to unit 106 which may pass the data to host system 104. Although not shown, each one of units 106 and 126 may include one or more suitable busses for communicating data and/or power between various components 108-119 and/or between various components 128-139.

Figure 2:
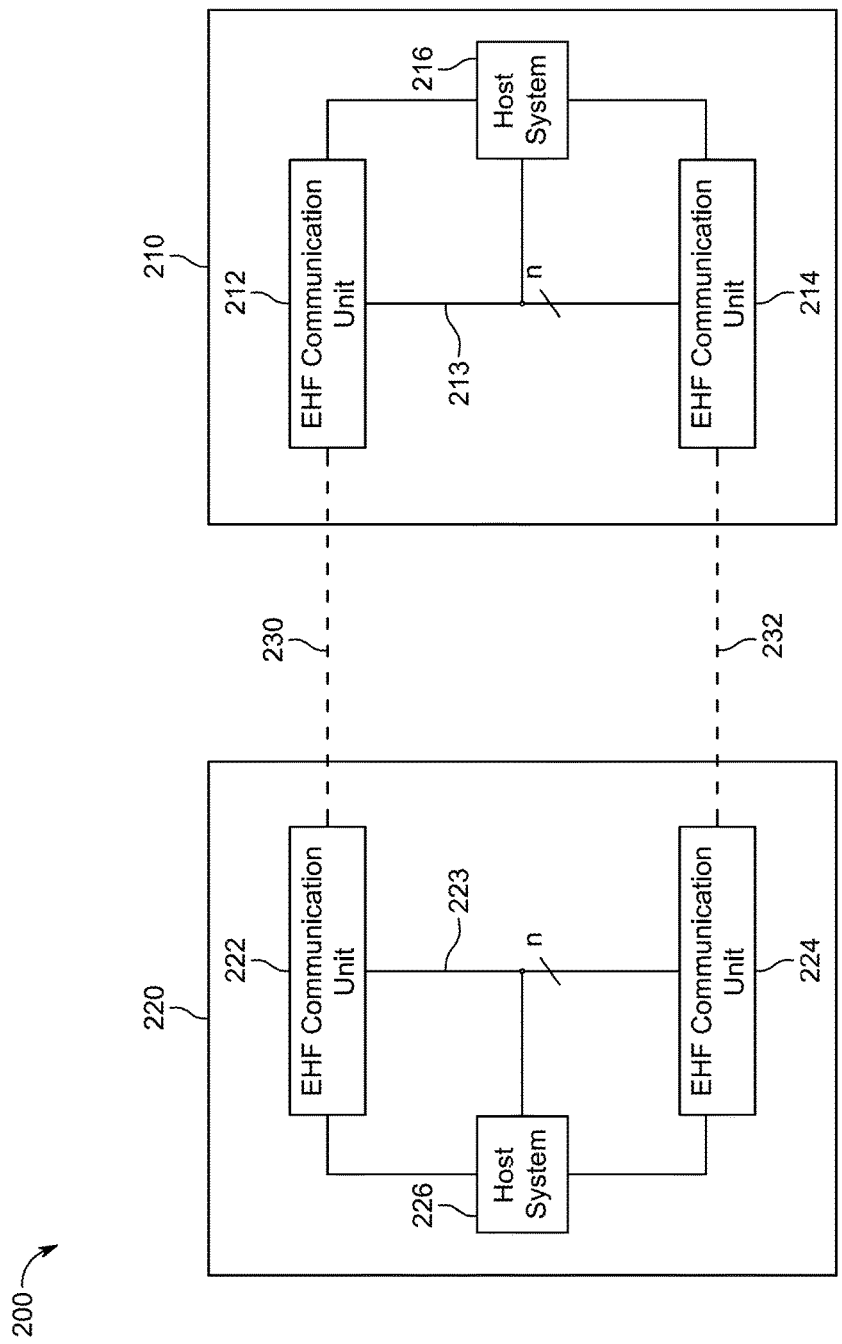
FIG. 2 illustrates a communications system having two electronic devices that communicate with one another over two or more contactless communications links, according to an embodiment.

FIG. 2 illustrates a communications system 200 wherein two electronic device subsystems or devices 210 and 220 may communicate with one another over two or more contactless communications links, according to an embodiment. System 200 may be similar to system 100 in many respects, but for illustrative and simplified discussion purposes, shows that each device may include two EHF communication units. Moreover, any EHF communication unit in system 200 may be the same or substantially the same as any EHF communication unit in system 100. As such, a more simplified representation of units 106 and 126 are shown in FIG. 2. If desired, each device can include several EHF communication units. First device 210 may include EHF communication unit 212, EHF communication unit 214, and host system 216. One or more wired paths 213 may directly connect EHF communication units 212 and 214 together. Host system 216 may communicate with EHF communication units 212 and 214. In some embodiments, EHF communication units 212 and 214 may communicate with each other through host system 216. In other embodiments, host system 216 may be able to drive a signal on at least one of wired paths 213. Similarly, second device 220 may include EHF communication unit 222, EHF communication unit 224, and host system 226. One or more wired paths 223 may directly connect EHF communication units 222 and 224 together. Host system 226 may communicate with EHF communication units 222 and 224. In some embodiments, EHF communication units 222 and 224 may communicate with each other through host system 226. In other embodiments, host system 226 may be able to drive a signal on at least one of wired paths 223. Host systems 216 and 226 may be similar to host systems 104 and 124, both of which include circuitry specific to their respective subsystems or devices and may thereby enable subsystems or devices 210 and 220 to operate for their intended functionality.

In some embodiments, each of EHF communication units 212, 214, 222, and 224 can be the same as EHF communication unit 106 or 126, discussed above. As such, EHF communication units 212, 214, 222, and 224 may include transceivers that may be capable of being configured to transmit and/or receive EHF signals. For example, in one approach, units 212 and 224 can be configured to receive EHF signals and units 214 and 222 can be configured to transmit EHF signals. Thus, in this approach, a contactless communications link 230 may exist between EHF communication units 222 and 212, and a contactless communications link 232 may exist between EHF communication units 214 and 224. As shown, units 212 and 222 may work together as a coupled pair of units that may communicate via link 230, and units 214 and 224 may work together as another coupled pair of units that may communicate via link 232. If one or more additional coupled pairs of units were to be included in system 200, then additional communications links would also exist.

After the units progress through their respective state machines and establish the links, and data no longer needs to be communicated across the links, the units can enter in a power savings state or data transport idle state depending on whether they are being implemented as a Tx or Rx unit. The power savings state may enable an EHF communication unit to power down selective circuitry, after the EHF communication link has been established, when there may be no data to be communicated over the link. The Tx unit may transmit a "keep alive" signal to the Rx unit to prevent it from timing out and exiting out of its power savings state. The Rx unit may be periodically turned on to monitor whether the Tx is sending the "keep alive" signal. The Tx and Rx units may transition to a new state (e.g., a data transport state) when they receive instructions to do so. As a specific example, an apparatus can include an EHF transceiver and control circuitry. The control circuitry may be operative to control establishment of an EHF communications link with another apparatus by executing a state machine that may transition from state to state in response to satisfaction of any one of a plurality of conditions, establish the EHF communication link with the apparatus to selectively enable one of transmission and reception of data, after the EHF communication link with the apparatus may be established, monitor an absence of data being communicated over the EHF communication link, and enter into a power savings state in response to the monitored absence of data being communicated over the EHF communication link until the state machine transitions to a new state.

Both devices 210 and 220 have the ability to control activation and deactivation of the links existing between the two devices. For example, if the links are in a power savings mode, and device 210 decides it wishes to transmit data to device 220, device 210 may change a signal state on one of the pins of one of its EHF units to bring it out of sleep and into an active data transport ready state. In response to the change in signal state, it may transmit a signal over the contactless communications link to its counterpart EHF unit, which may exit out of its power state and enter into an active data transport state. In addition, the counterpart EHF unit may inform other circuitry within device 220 that incoming data traffic is about to commence and that any appropriate changes are put into effect so that the data can be handled properly. For example, in the context of various embodiments described herein, when the counterpart EHF unit is contained in an adapter device that is electrically coupled to a user device, the counterpart EHF unit may provide a signal that causes adapter circuitry to turn off an active connection coupling a memory to the user device and activate a connection coupling the memory to the EHF unit.

Figure 3:
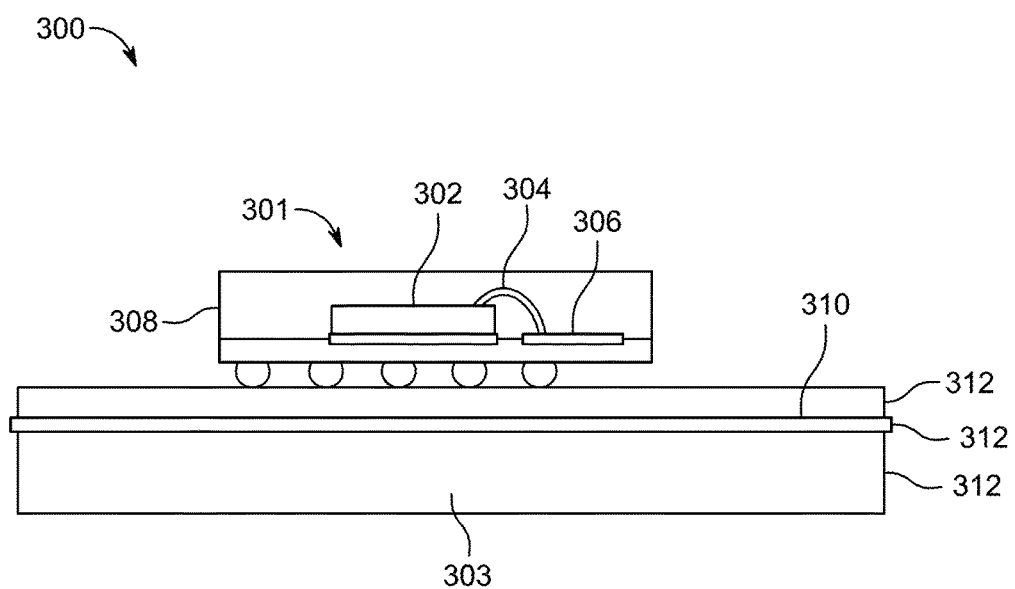
FIG. 3 is a side view of an exemplary EHF communication circuit showing a simplified view of some structural components.

FIG. 3 is a side view of an exemplary EHF communication circuit 300 showing a simplified view of some structural components. As illustrated, the communication circuit may include an integrated circuit package 301 that includes die 302 mounted on connector printed circuit board (PCB) 303, a lead frame (not shown), one or more conductive connectors such as bond wires 304, a transducer such as antenna 306, and an encapsulating material 308.

Die 302 may include any suitable structure configured as a miniaturized circuit on a suitable die substrate, and is functionally equivalent to a component also referred to as a "chip" or an "integrated circuit (IC)." The die substrate may be formed using any suitable semiconductor material, such as, but not limited to, silicon. Die 302 may be mounted in electrical communication with the lead frame. The lead frame may be any suitable arrangement of electrically conductive leads configured to allow one or more other circuits to operatively connect with die 302. The leads of the lead frame may be embedded or fixed in a lead frame substrate. The lead frame substrate may be formed using any suitable insulating material configured to substantially hold the leads in a predetermined arrangement.

Further, the electrical communication between die 302 and leads of the lead frame may be accomplished by any suitable method using conductive connectors such as, one or more bond wires 304. Bond wires 304 may be used to electrically connect points on a circuit of die 302 with corresponding leads on the lead frame. In another embodiment, die 302 may be inverted and conductive connectors including bumps, or die solder balls rather than bond wires 304, which may be configured in what is commonly known as a "flip chip" arrangement. Transducer 306 may be any suitable structure configured to convert between electrical and electromagnetic signals. In some embodiments, transducer 306 is an antenna. Transducer 306 in conjunction with the circuitry on die 302 may be configured to operate in an EHF spectrum, and may be configured to transmit and/or receive electromagnetic signals, in other words as a transmitter, a receiver, or a transceiver. In an embodiment, transducer 306 may be constructed as a part of the lead frame. IC package 301 may include more than one transducer 306. In another embodiment, transducer 306 may be separate from, but operatively connected to die 302 by any suitable method, and may be located adjacent to die 302. For example, transducer 306 may be connected to die 302 using bond wires. Alternatively, in a flip chip configuration, transducer 306 may be connected to die 302 without the use of the bond wires. In other embodiments, transducer 306 may be disposed on die 302 or on PCB 312.

Encapsulating material 308 may hold the various components of IC package 301 in fixed relative positions. Encapsulating material 308 may be any suitable material configured to provide electrical insulation and physical protection for the electrical and electronic components of the IC package. For example, encapsulating material 308 may be a mold compound, glass, plastic, or ceramic. Encapsulating material 308 may be formed in any suitable shape. For example, encapsulating material 308 may be in the form of a rectangular block, encapsulating all components of the IC package except the unconnected leads of the lead frame. One or more external connections may be formed with other circuits or components. For example, external connections may include ball pads and/or external solder balls for connection to a printed circuit board.

IC package 301 may be mounted on a connector PCB 303. Connector PCB 303 may include one or more laminated layers 312, one of which may be a PCB ground plane 310. PCB ground plane 310 may be any suitable structure configured to provide an electrical ground to circuits and components on the IC package. With the placement of the ground layer, at an appropriate distance from the antenna, the electromagnetic radiation pattern may be directed outwards from the substrate.

Figure 4:
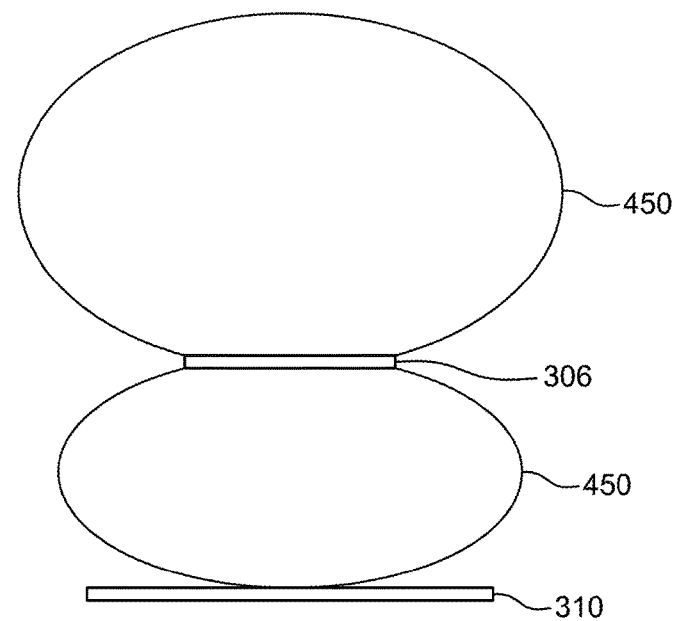
FIG. 4 illustrates a representative of a characteristic radiation pattern resulting from the communication device of FIG. 3.

FIG. 4 illustrates a characteristic radiation pattern 450 resulting from the communication device 300 of FIG. 3. Device 300 is shown as a simplified cross-sectional view that emphasizes the position of antenna 306 with respect to ground plane 310. Characteristic pattern 450 may be produced by a simulation of an electromagnetic signal emanating from an exemplary representation of communication device 300. Characteristic pattern 450 shows the EM signal emanating downwards away from antenna 306 towards ground plane 310 and upwards away from antenna 306. The EM signal energy above antenna 306 includes any EM signal energy that is reflected back from ground plane 310. As such, positioning of ground plane 310 below antenna 306 provides a minimal level of EM signal directivity (e.g., EM signal directivity in an upwards direction away from antenna 306).

Despite the positioning of ground plane 310 relative to antenna 306, the ground plane's ability to affect the directivity of the EM signal is limited and any achieved directivity is subject to variation. For example, the EM signal emanating above antenna 306 is relatively unfocused in that it has a relatively wide dispersal relative to its origination at antenna 306. Such a wide dispersal can result in a decreased signal to noise ratio, cross-talk with other adjacent EM signals, and unwanted interference. In addition, because the distance between antenna 306 and ground plane 310 can vary depending on various factors such as, for example, manufacturing tolerances, design choice, etc., this variation can result in inconsistent directivity from one application to the next. Embodiments discussed herein enhance the directivity of the EM signal emanating from an antenna by using one or more EHF focusing layers in combination with the antenna and the ground plane. In addition, use of the EHF focusing layers enables the distance between the antenna and the ground plane to be tightly controlled.

Embodiments discussed herein can include a cavity backed reflective lens constructed from multiple EHF focusing layers stacked on top of each other and embodied within the confines of a printed circuit board. The cavity backed reflective lens can combine the advantages of a cavity backed antenna and a parabolic reflector antenna. In a cavity backed antenna, the energy radiated from the antenna into the cavity is reflected back to the antenna in a manner such that the phase relation results in constructive interference. Constructive interference effectively increases antenna gain and/or directivity of the energy away from the cavity. In a parabolic reflector antenna, an EHF energy reflecting paraboloid is placed behind an antenna such that the antenna is placed in or near the focal point of the paraboloid. The energy from the antenna is reflected off the parabolic surface of the paraboloid and results in a narrower beam of RF energy being radiated away from the antenna. It should be appreciated that the parabolic shape is an example. The resulting shape of the cavity backed reflective lens may not necessarily be a parabola, but exhibits a cavity of a particular shape.

The EM signal energy can be re-radiated by a combination of the cavity backed reflective lens and the constructive interference provided by at least one intermediate EHF focusing layer, wherein the at least one intermediate EHF focusing layer exists between a top EHF focusing layer and a bottom EHF focusing layer. In some embodiments, the constructive interference is a product of the positioning of the intermediate layers that make up the cavity backed reflective lens.

In cavity backed reflective (CBR) lens embodiments in which the cavity resembles a paraboloid, it should be understood that the paraboloid can be symmetric or asymmetric. The actual shape of the paraboloid may be chosen to provide the best antenna performance for a given usage scenario. In other embodiments, the CBR lens can have a cavity that resembles a number of different 3D shapes. For example, the cavity can resemble a trapezoidal shape (e.g., specifically a pyramid shape), a tetrahedron shape, a frustoconical shape, a cuboid shape, a cube shape, a spherical shape, an elliptical shape, or a cylindrical shape. Different shapes can be selected to steer the EM beam in a particular direction.

In some embodiments, the CBR lens is confined to the thickness of a printed circuit board. Since it may be desirable to use the thinnest circuit board possible (e.g., to reduce real estate space and costs), such a thin board can present design challenges in directing RF energy away from the CBR lens and minimize scattering of energy in undesired directions to reduce cross-talk among adjacent antennas. For example, a circuit board can be about 1 mm thick, 0.5 min to 1 mm thick, or 0.5 mm to 1.5 mm thick. In addition, such a thin circuit board makes it difficult to achieve an optimal distance (e.g., less than ¼ wavelength of the RF energy) between a ground plane and the antenna in order to make the antenna less susceptible to other electronics contained within a device using the antenna. In addition, having the distance between the ground plane and the antenna at less than ¼ of the RF signal's wavelength increases the effectiveness of the antenna. Details related to various CBR lenses are now discussed.

Figure 5:
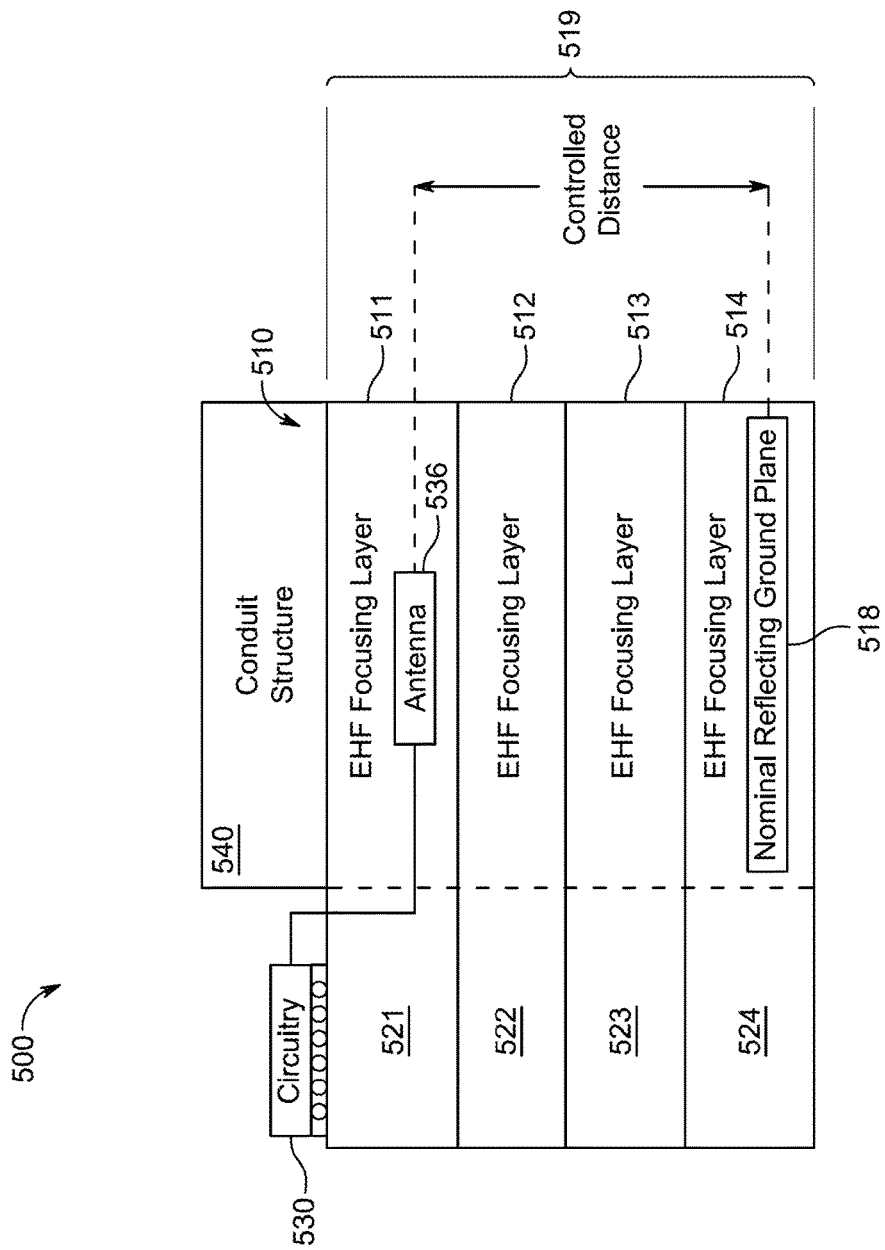
FIG. 5 shows an illustrative block diagram of an EHF focusing module according to an embodiment.

FIG. 5 shows an illustrative block diagram of EHF focusing module 500 according to an embodiment. EHF focusing module 500 can include EM focusing structure 510, circuitry 530, antenna 536, and optional conduit structure 540. EM focusing structure 510 may include EHF focusing layers 511-514 and non-focusing layers 521-524. Both focusing layers 511-514 and non-focusing layers may be constructed using conventional printed circuit board lamination and etching techniques. EHF focusing layers 511-514 may differ from non-focusing layers 521-524 in that focusing layers 511-514 are designed and constructed to collectively provide cavity backed reflective lens 519 that sharpens (or narrows) and directs the shape of the EM signal energy emanating from antenna 536. In effect, reflective lens 519 narrows the EM signal beam emanating from antenna 536 relative to the EM signal beam that would emanate from antenna 536 in an application that relies solely on a ground plane for reflecting EM signal energy. As shown, reflective lens 519 can also include antenna 536 and ground plane 518.

Module 500 shows that layers 511-514 are aligned with layers 521-524, respectively, and are separated by dashed line 515. The separation is merely illustrative and does not necessarily mean that layers 511-514 and layers 521-524 are discrete components that are mated together. In some embodiments, layers 511 and 521, layers 512 and 522, and so on, may be formed from the same lamination and etch layers, but layers 511-514 have been specifically constructed to provide the reflective lens according to embodiments discussed herein, whereas layers 521-524 provide signal, power, and ground routing as normally expected in such substrates.

Circuitry 530 and antenna 536 may, collectively, operate similar as to how EHF communications unit 212 operates.

As shown, circuitry 530 is electrically coupled to antenna 536. FIG. 5 shows that antenna 536 is positioned with respect to one of EHF focusing layers 511-514 and that circuitry 530 is mounted to layer 521. The positioning of antenna 536 can be placed anywhere with respect to the reflective lens formed by EHF focusing layers 511-514. For example, antenna 536 may be placed co-planer with a surface (e.g., top surface) of any one of EHF focusing layer 511-514 or within any one of EHF focusing layers 511-514. As illustrated in FIG. 5, antenna 536 is positioned within EHF focusing layer 511.

Nominal reflecting ground plane 518 may be associated with one of EHF focusing layers 511-514 and may serve as the primary reflecting portion of the reflective lens 519. In some embodiments, ground plane 518 may be associated with the bottom most EHF focusing layer of reflective lens 519, such as, for example, EHF focusing layer 514. Ground plane 518 may be constructed from a material that prevents EM signal energy from transmitting through it. For example, ground plane 518 may be constructed from a metal such as copper. The distance between antenna 536 and ground plane 518 may be a controlled distance because the location of both antenna 536 and ground plane 518 can be specifically positioned during construction of reflective lens 519. As a result, the potential for distance variations between antenna 536 and ground plane 518 are reduced.

Optional conduit structure 540 may be operative to guide EM signals through pathways that can minimize or eliminate crosstalk among adjacent paths within a device and across devices. The conduit structures can be constructed from a combination of different materials to shape the direction of signal propagation and to mitigate EHF leakage (which may cause cross-talk). These materials can include EHF transmissive materials that are operable to facilitate propagation of EHF signals, EHF reflective materials that are operable to reflect EHF signals, and EHF absorptive materials that are operable to absorb EHF signals. Examples of transmissive materials can include plastics and other materials that are electrically non-conductive (i.e., dielectric). Reflective materials can include, for example, metals, metal alloys, metal foam, and other materials that are electrically conductive. Absorptive materials by definition will have a conductive component, or more exactly, have a loss mechanism that is modeled by a conductive or resistive component. They are often not very conductive for static fields, but can exhibit high dissipative loss at RF frequencies. For example some classes of magnetically loaded materials exhibit loss due to hysteresis losses in ferromagnetic materials. EHF dampening is not due to the permittivity and permeability, but due to other dissipative properties of the materials.

In some embodiments, the conduit structures can be constructed from just one of the different material types. For example, the conduit structure can be constructed from just the EHF transmissive material or just the EHF reflective material. In other embodiments, the structure can be constructed from two or more of the different material types. For example, one portion can be constructed from transmissive materials, and another portion can be constructed from reflective materials.

Conduit structure 540 may be constructed to exhibit any suitable shape, and can be constructed from a single component or multiple components. Regardless of shape and construction configuration, each conduit may include at least one signal collimating structure that has a channel existing within the collimating structure. Any suitable shape, including for example, rectangular, elliptical, or polygonal shapes of any suitable dimension may characterize each channel. The collimating structure may be constructed from, lined with, or coated with an EHF reflective material that may simultaneously guide EHF signals along the channel and prevent those same signals from penetrating the channel wall.

In addition to providing one or more pathways for channeling EHF signals, the conduit structures may protect the EHF CCUs from shock events. That is, during an event that imparts shock energy to the device, such as a device drop, the conduit structure can absorb the shock to prevent potentially damaging energy transfer to the EHF CCUs. In one embodiment, the shock protection can be achieved by constructing at least a portion of the conduit structure from a relatively rigid material (e.g., plastic) that covers the EHF CCU(s). In another embodiment, shock protection can be achieved using a relatively compliant material (e.g., foam) that also covers the EHF CCU(s). In yet another embodiment, a combination of relatively rigid and compliant materials may be used to provide protection.

The conduit structure may also be constructed to account for tolerance variations in device stackup. That is, variations in component construction can vary the stackup tolerances when assembled. For example, the distance between the EHF units and the interface may vary depending on construction and variations in components. In one build, the distance may be x and in another build, the distance may be y, where y is greater than x. The conduit structure may include a compliant material that is designed to accommodate variations in stackup. The compliant material may be compressible and thus able to ensure that the conduit structure makes a secure and flush connection with the interface.

In some embodiments, reflective lens 519 and conduit structure 540 may each be designed to complement each other in ensuring optimal transmission of EM signals to and/or from antenna 536. In some embodiments, conduit structure 540 may exist outside of module 500. For example, conduit structure 540 may exist in a counterpart device with which module 500 communicates.

Figure 6A:
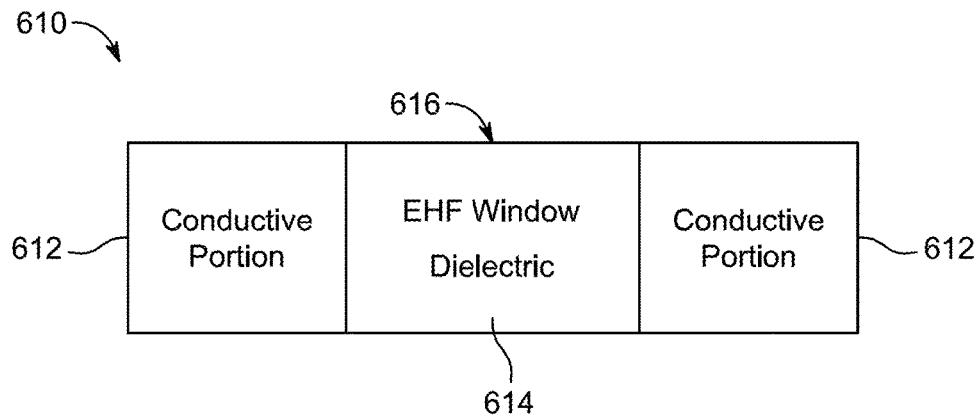
FIGS. 6A-6C show different illustrative compositions of EHF focusing layers according to various embodiments.
Figure 6B:
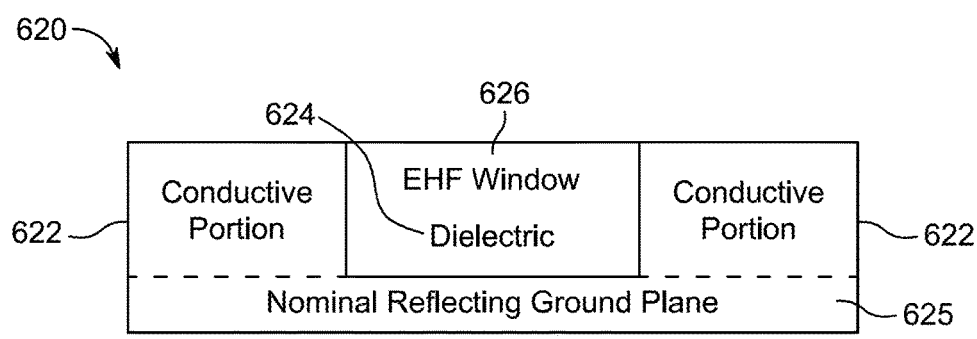
Figure 6C:
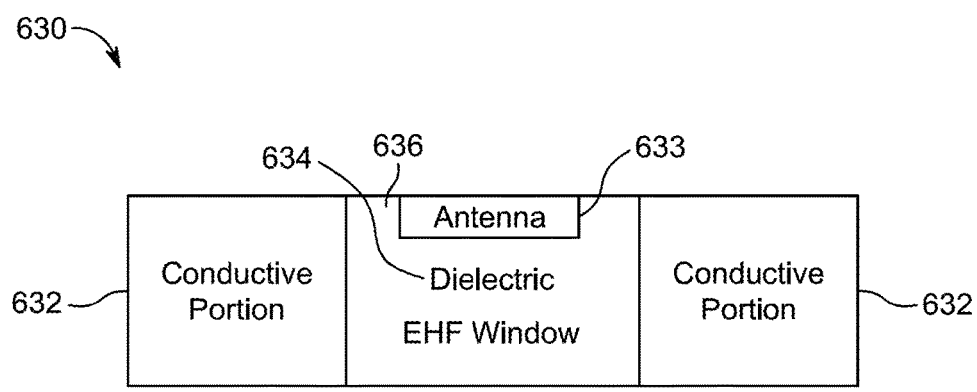

FIGS. 6A-6C show different illustrative compositions of EHF focusing layers according to various embodiments. FIG. 6A shows EHF focusing layer 610 that includes conductor portions 612 and dielectric portion 614. Conductor portions 612 may block EM signals from passing through, whereas dielectric portion 614 may allow EM signals to pass through. Conductor portions 612 may be realized through placement of conductive vias or a contiguous metal frame within dielectric portion 614. The spacing between the vias may be such that the EM signals are not able to pass through any gaps between the vias. In addition, conductor portions 612 may include planar conductive substrates or layers. The size and shape of conductor portion 612 and dielectric portion 614 define an EHF focusing window 616. EHF focusing window 616 may have a cross-sectional area that differs from the cross-sectional area of other EHF focusing windows (e.g., EHF focusing windows 626 and 636 of FIGS. 6B and 6C). Thus, when multiple EHF focusing layers are stacked on top of each other, the variations of the cross-sectional area of the EHF focusing windows form the cavity backed reflective lens (e.g., see FIGS. 7A-7C, 8A-8C, and 9). EHF focusing window 616 may exist throughout the entire thickness of layer 610.

FIG. 6B shows EHF focusing layer 620 that includes conductive portions 622, dielectric portion 624, and nominal reflective ground plane 625. EHF focusing window 626 is defined by the positioning of conductive portions 622 and ground plane 625. Ground plane 625 may define the bottom of the cavity backed reflective lens constructed through stacking of multiple focusing layers. As a result, EHF focusing window 626 may not exist through the entire thickness of layer 620. In addition, because ground plane 625 exists in layer 620, layer 620 may form the bottom most layer of a stack of EHF focusing layers. Any EM signal energy that passes through the EHF window 626 is reflected back from ground plane 625 back up through the reflective lens formed by the stacking of EHF focusing layers.

FIG. 6C shows EHF focusing layer 630 that includes an antenna 633 according to an embodiment. In addition, EHF focusing layer 630 can include conductive portions 632 and dielectric portion 634, which together, form EHF focusing window 636. Antenna 633 may be placed anywhere within EHF focusing window 636. For example, antenna 633 may be placed at the top, bottom, or anywhere between the top and bottom of layer 630. In some embodiments, layer 630 may form the top layer of the reflective lens or layer 630 may exist as middle layer within the cavity backed reflective lens.

Figure 6D:
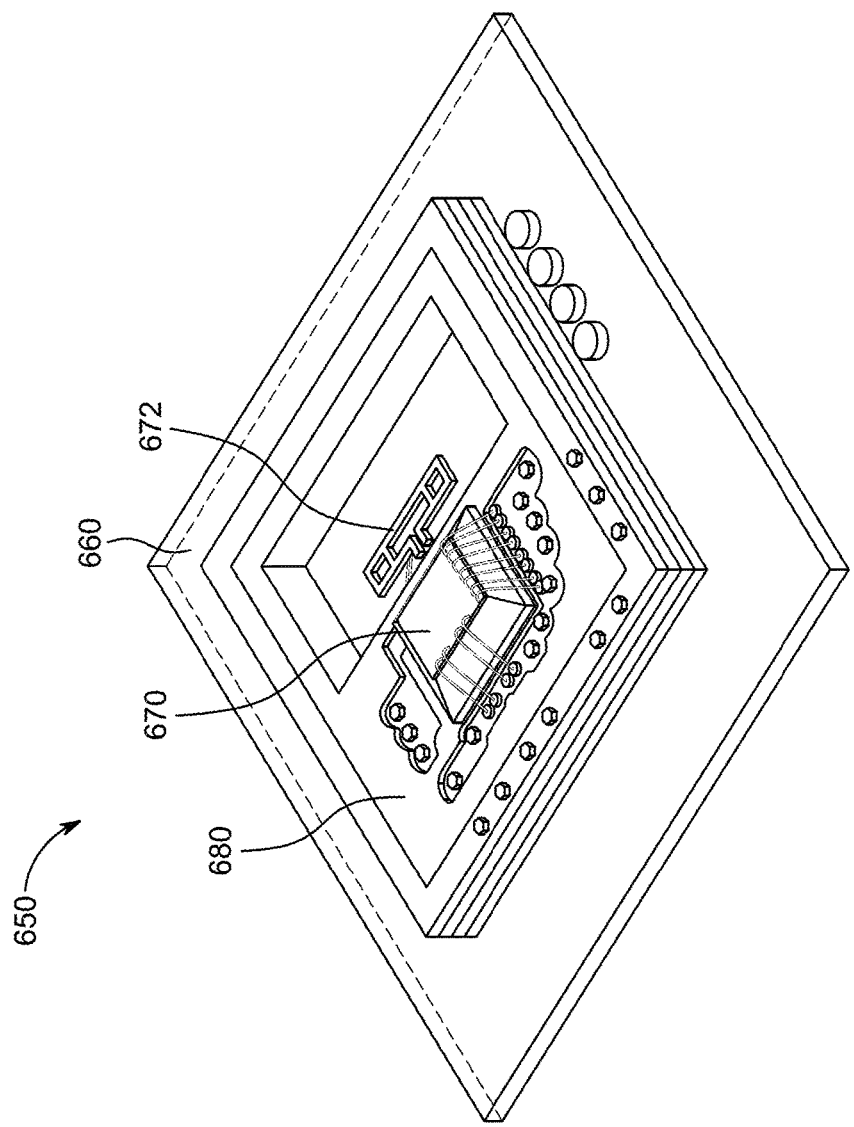
FIGS. 6D and 6E show different views of a lens 650 according to an embodiment.
Figure 6E:
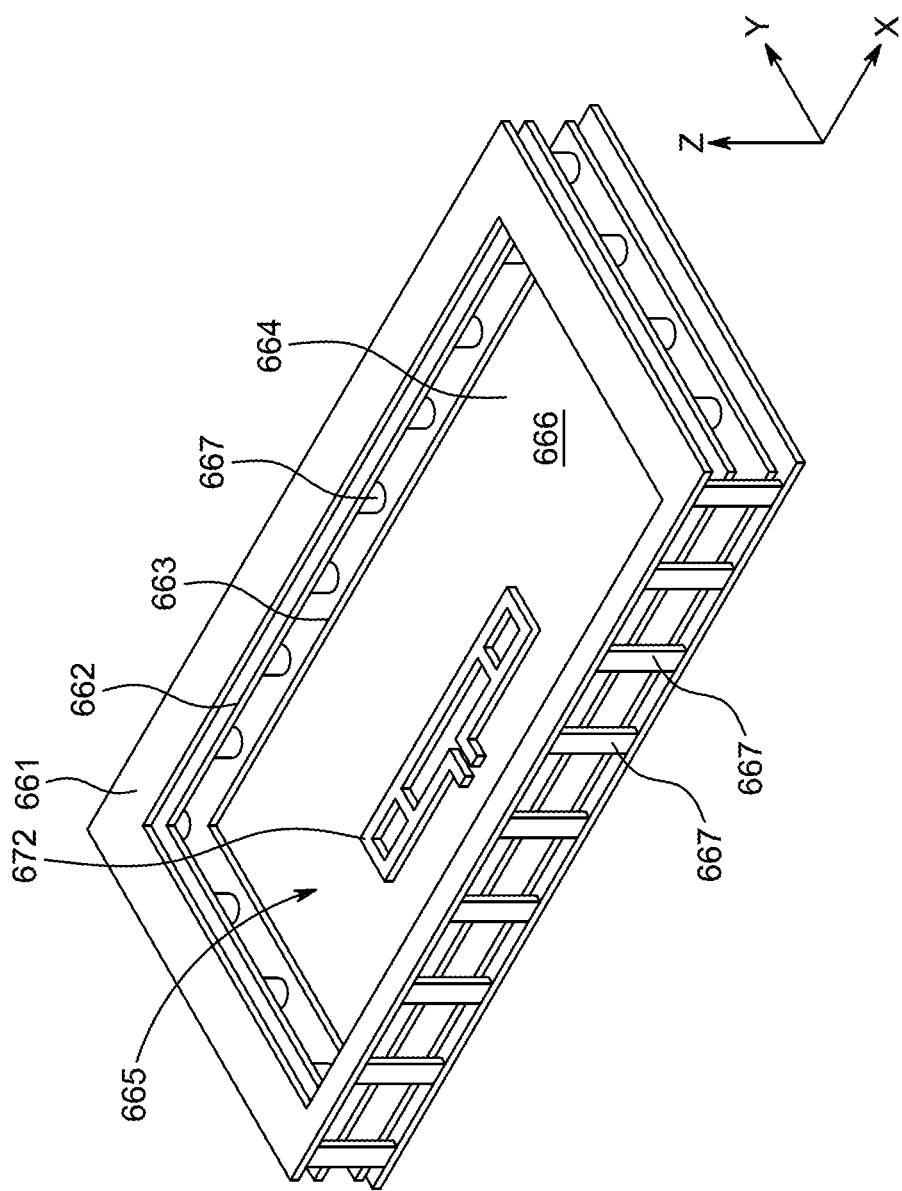
Figure 6F:
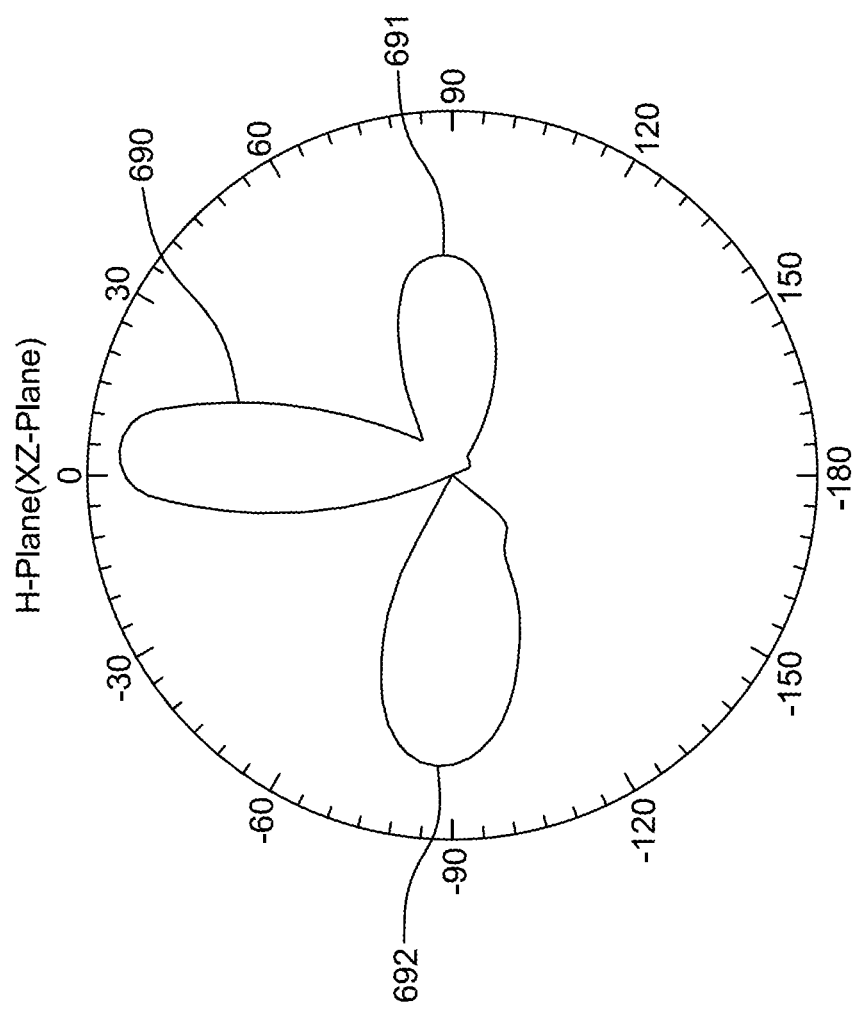
FIG. 6F shows a simulated radiation pattern based on the lens of FIGS. 6D and 6E, according to an embodiment.

Referring now to FIGS. 6D-6F, FIGS. 6D and 6E show different views of CBR lens 650 according to an embodiment, and FIG. 6F shows a simulated radiation pattern based on CBR lens 650, according to an embodiment. In particular, FIG. 6D shows a perspective view of CBR lens 650 integrated within circuit board 660. In general CBR lens 650 has little to no parabolic shape in its cavity. Also shown in FIG. 6D, CCU circuitry 670 is mounted on top of circuit board 660 and is adjacent to CBR 650. Circuit board 660 may be positioned on substrate 680, which may be, for example, a device housing or other structure that can support circuit board 660. FIG. 6E shows a detailed view of CBR 650, and in particular, shows different layers 661-664 of circuit board 660. Layers 661-663 may be have equally sized cut outs that form cavity 665 within board 660, and layer 664 may represent ground plane 666. Vias 667 may define the perimeter of cavity 665. Antenna 672 may be a dipole antenna that is positioned co-planar with top layer 661.

FIG. 6F shows RF radiation pattern in the XZ plane. The radiation pattern shows a main lobe 690, side lobe 691, and side lobe 692. Main lobe 690 is desired as it represents RF signal energy being directed up away from CBR 650 in the Z direction. Side lobes 691 and 692 are less desired because they represent undesired RF signal energy directionality (i.e., primarily in the +/−X directions).

Figure 7A:
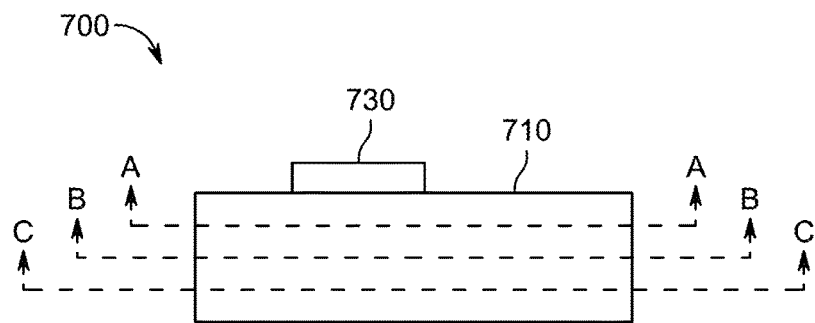
FIGS. 7A-7C show top, side, and perspective views, respectively of a module according to an embodiment.
Figure 7B:
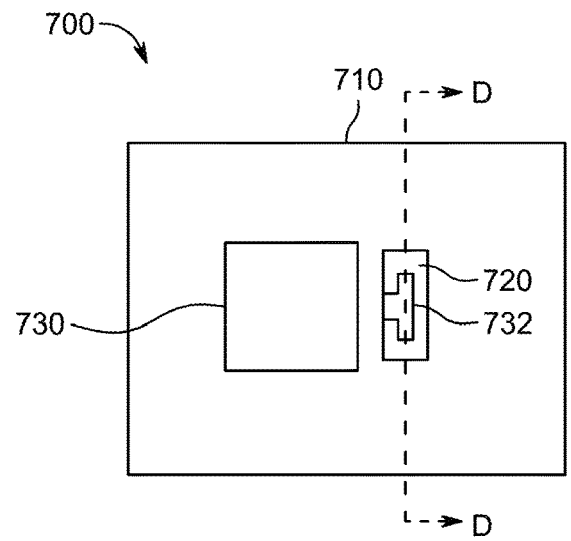
Figure 7C:
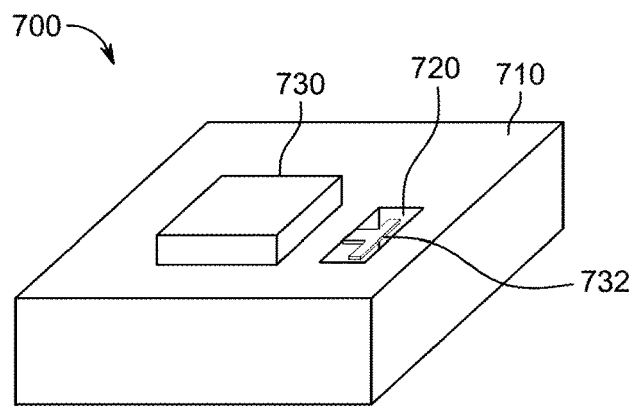

FIGS. 7A-7C show top, side, and perspective views, respectively of module 700 according to an embodiment. Module 700 can include substrate 710, which has reflective lens 720 incorporated therein, CCU control portion 730 and CCU antenna 732. For example, reflective lens 720 may be constructed using EHF focusing layers as discussed above in connection with FIGS. 5 and 6A-6C. CCU control portion 730 may be mounted to substrate 710 and is operative to process contactless signals transmitted by or received by CCU antenna 732. CCU antenna may be any suitable antenna that is electrically connected to CCU control portion 730. Antenna 732 can be, for example, a dipole antenna or a folded dipole antenna. In addition, antenna 732 may be sized that it is one half wavelength of the EHF signal it transmits or receives. The driving impedance of antenna 732 can be relatively low because it is located relatively close to the ground plane. In one embodiment, the folded dipole antenna can have in intrinsic 4:1 impedance transformation compared to a simple dipole in free space. In addition, the dipole loop can be shorted at each end (as shown in antenna 672 of FIGS. 6D and 6E) to improve both impedance and bandwidth of the antenna. The shorting at both ends of the dipole antenna has the effect of converting it to shunt fed "T"

match. If desired, module 700 may be part of a system circuit board or main logic board of a device (e.g., phone or computer), or it may be a stand-alone component to connects to another board via, for example, a connector. Module 700 can exhibit a CBR with a parabolic-shaped lens incorporated in the cavity, which may or may not be symmetrical, in which metal layers and via form increasingly smaller openings from the top to the bottom of the module.

Figure 8A:
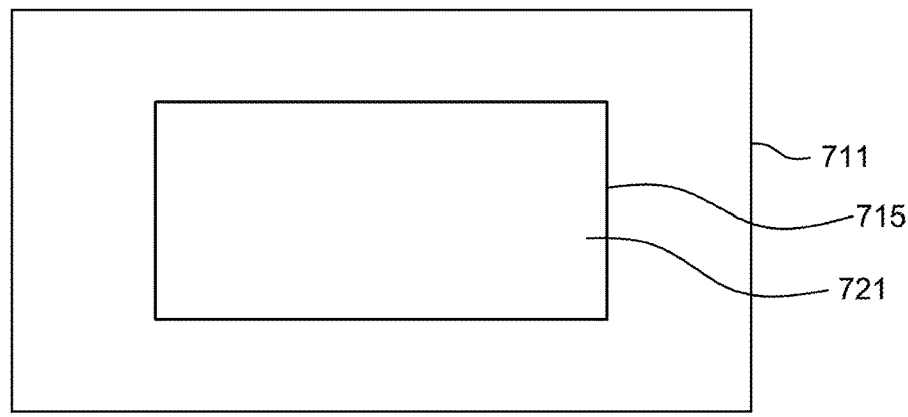
FIGS. 8A-8C show different cross-sectional views of the reflective lens of the module of FIG. 7A, according to an embodiment.
Figure 8B:
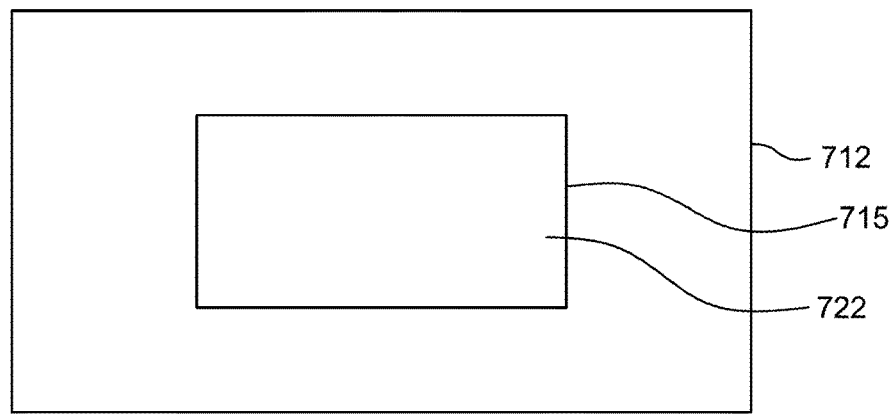
Figure 8C:
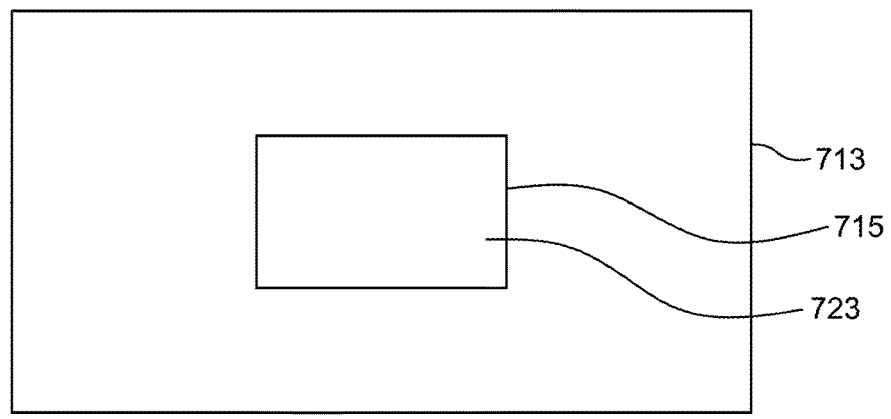

FIGS. 8A-8C show different cross-sectional views of reflective lens 720 of module 700, taken along lines A-A, B-B, and C-C, respectively, of FIG. 7A. Each cross-sectional view shows a different EHF focusing window, and each EHF focusing window is shown to have a different cross-sectional area. Assuming, for example, that reflective lens 720 is constructed from three EHF focusing layers, wherein top layer 711 is represented in FIG. 8A, middle layer 712 is represented in FIG. 8B, and bottom layer 713 is represented in FIG. 8C. The EHF focusing window of each layer can be defined by several conductive vias that form the perimeter of the EHF focusing window. The vias may be spaced apart such that interstitial gaps existing between vias are small enough to prevent RF signals from pass through the gaps. In other words, the spacing of vias forms an EM fence even though there is no contiguous trace of metal. In another embodiment, the focusing window can be defined by a contiguous conductive fence. The cross-sectional area of the EHF focusing window decreases in size as the reflective lens progress from top layer 711 to bottom layer 712. Thus, the cross-sectional area of EHF focusing window 721 is greater than the cross-sectional area of EHF focusing window 722, which has a greater cross-sectional area than EHF focusing window 723. This is also illustrated in FIG. 9A.

Figure 9A:
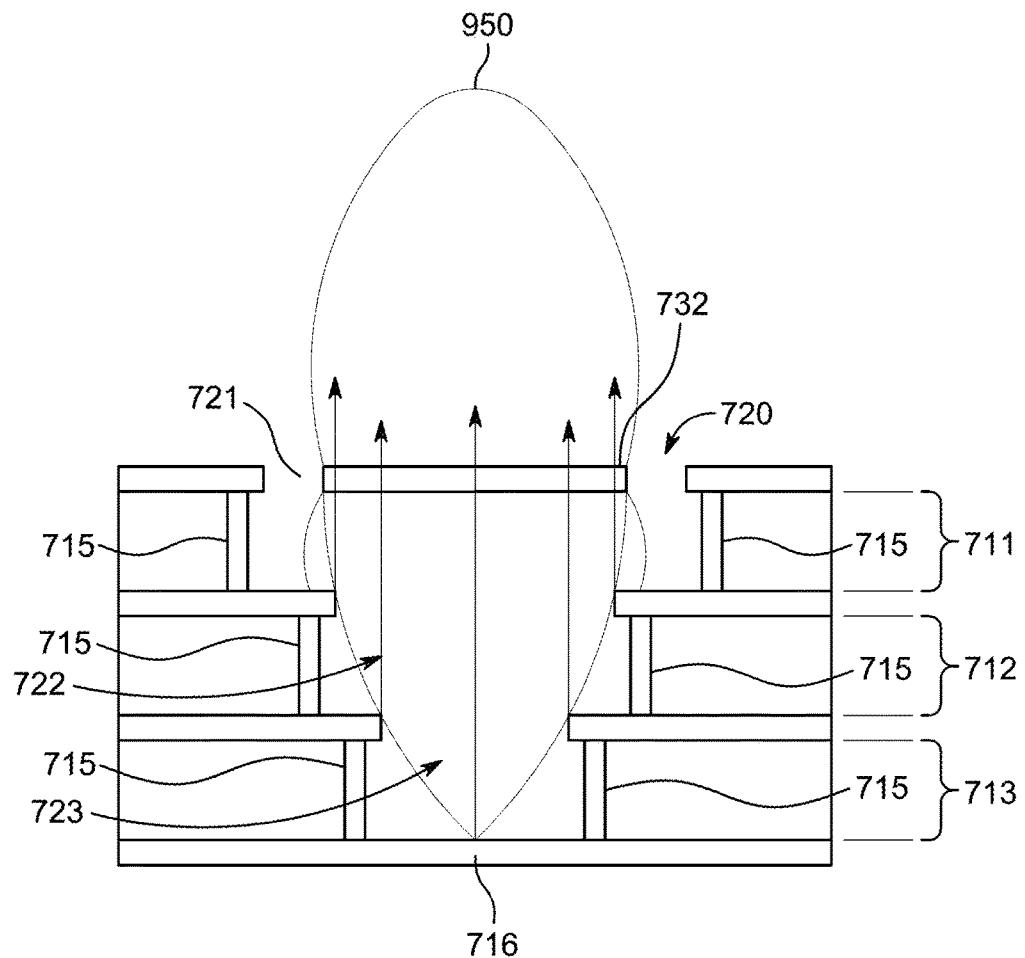
FIG. 9A shows another cross-sectional view of the reflective lens of the module of FIG. 7B, according to an embodiment.

FIG. 9A shows another cross-sectional view of reflective lens 720 of module 700, taken along lines D-D of FIG. 7B. Reference may be made collectively to FIGS. 8A-8C and FIG. 9A. Conductive vias 715 may define the boundaries of each EHF focusing window. Nominal reflecting ground plane 716 may exist in bottom layer 712 to define an edge of reflective lens 720. FIG. 9A also illustrates a representative of a characteristic radiation pattern 950 resulting from module 700. Characteristic pattern 950 may be produced by a simulation of an electromagnetic signal emanating from an exemplary representation of module 700. Characteristic pattern 950 shows the EM signal emanating downwards away from antenna 732 towards ground plane 716 and upwards away from antenna 732. The EM signal energy above antenna 732 includes any EM signal energy that is reflected back from ground plane 716 via reflective lens 720. Compared to characteristic pattern 450 of FIG. 4, the resulting EM signal emanating from module 700 is more narrowly focused. This can result in less cross-talk, a better signal-to-noise ratio, and a more energy efficient contactless communications link.

FIG. 9B shows an illustrative RF signal radiation pattern emanating in the XZ plane of reflective lens 720, according to an embodiment. In particular, FIG. 9B shows main lobe 960, which represents RF signal energy being directed primarily along the Z axis away from reflective lens 720. The side lobes are minimal and thus are not shown in the illustrative radiation pattern.

Figure 9C:
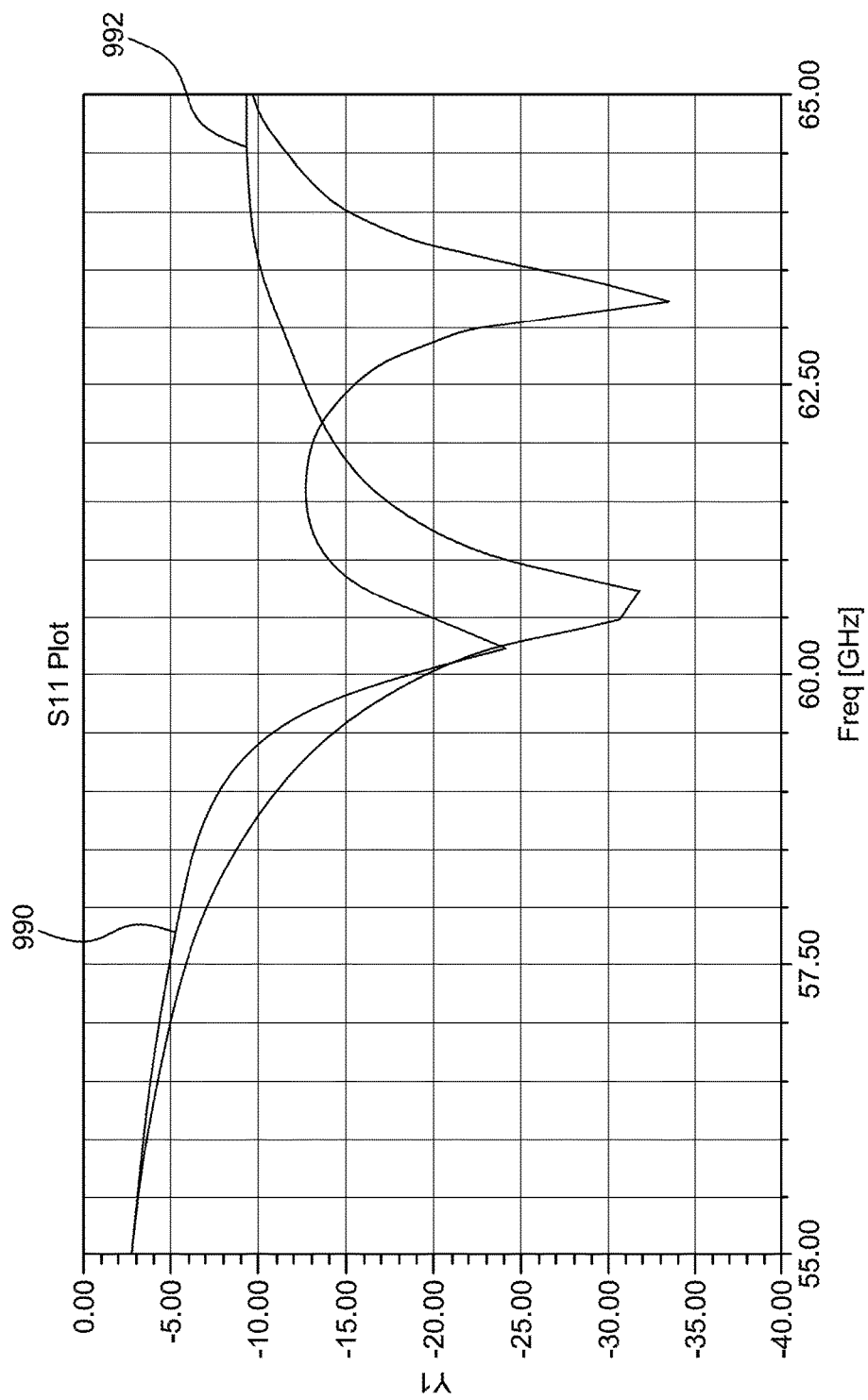
FIG. 9C shows an illustrative graph showing frequency response of, according to an embodiment.

FIG. 9C shows an illustrative graph showing frequency response of CBR 650 and module 700, according to an embodiment. Plot 990 shows the frequency response of CBR 650 and plot 992 shows the frequency response of CBR 700. In comparing plots 990 and 992, plot 992 exhibits a wider antenna bandwidth than plot 990. The increased bandwidth is the result of using different sized apertures, which behave like closely coupled resonators, in the cavity. The increased bandwidth increases the frequency range over which the antenna is effective. In addition, having increased bandwidth enables the antenna to perform similarly over a larger modulating frequency range.

The focusing of the EM signal is based on the geometry of cavity backed reflective lens 720, the materials used in construction of reflective lens 720, the positioning of antenna 732 with respect to reflective lens 720, and any other suitable criteria. As mentioned above, the relative thinness of the circuit board compromises the ability to direct the EM beam, however, the cavity backed reflective lens maximizes the constructive interference of the EM energy being re-radiated to thereby increase antenna bandwidth and EM beam directivity and shape. The relationship between the antenna and the cavity backed reflective lens (and its construction) can determine how the EM beam is shaped and directed.

Figure 10A:
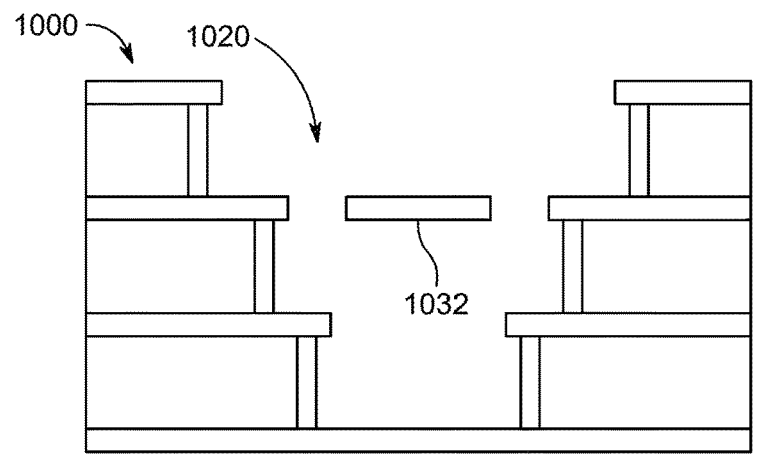
FIG. 10A shows an illustrative cross-section of a module that has an antenna mounted within its reflective lens, according to an embodiment.

FIG. 10A shows an illustrative cross-section of module 1000 that has antenna 1032 mounted within reflective lens 1020, according to an embodiment. The positioning of antenna 1032 (as compared to antenna 732 of FIG. 9A) shows that it is positioned below the top layer and substantially co-planer with the middle layer. Assuming module 700 and module 1000 are the same except for placement of their respective antennas, the characteristic EM pattern emanating from both modules may be different.

Figure 10B:
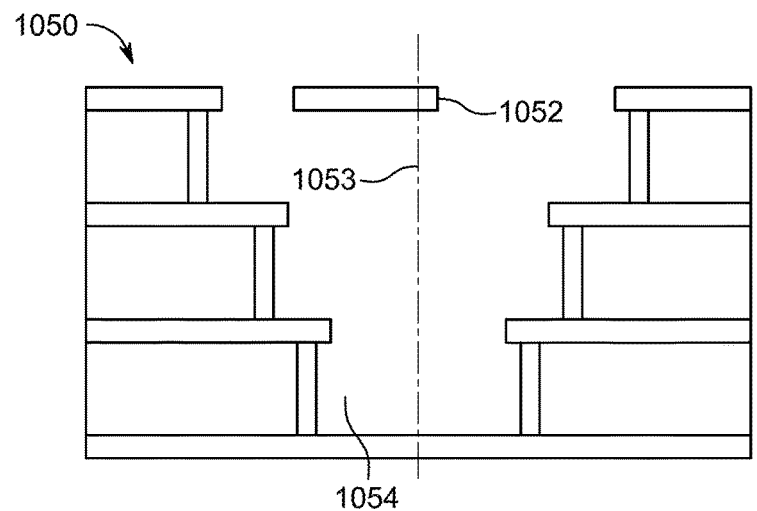
FIG. 10B shows another illustrative cross-section of a module having an antenna positioned offset (to the left) with respect to a center axis, according to an embodiment.
Figure 10C:
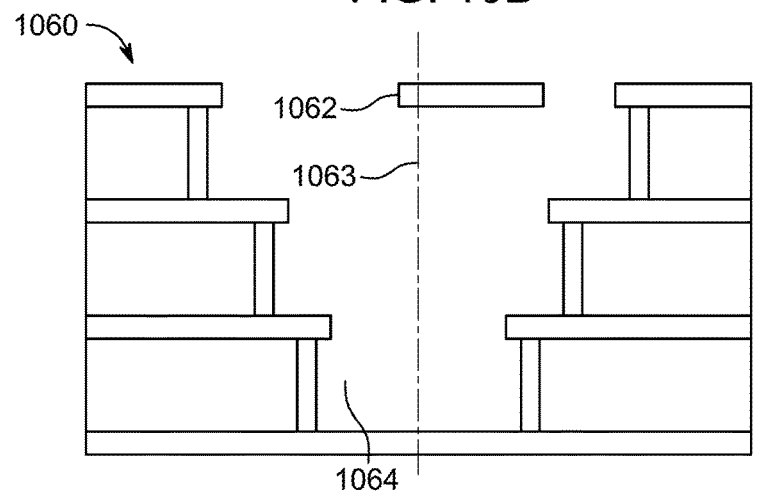
FIG. 10C shows another illustrative cross-section of a module having an antenna positioned offset (to the right) with respect to a center axis, according to an embodiment.

FIG. 10B shows another illustrative cross-section of module 1050 that has antenna 1052 positioned offset (to the left) with respect to a center axis 1053 of cavity 1054. Lobe 970 of FIG. 9B shows an illustrative RF signal radiation pattern emanating in the XZ plane of module 1050. The left-mounted offset position of antenna 1052 steers the RF signal in a different direction (shown as being steered towards the right) than lobe 960. FIG. 10C shows another illustrative cross-section of module 1060 that has antenna 1062 positioned offset (to the right) with respect to a center axis 1063 of cavity 1064. Lobe 980 of FIG. 9B shows an illustrative RF signal radiation pattern emanating in the XZ plane of module 1060. The right-mounted offset position of antenna 1062 steers the RF signal in a different direction (shown as being steered towards the left) than lobe 960.

Beam steering can also be accomplished by arranging EHF focusing layers embedded within the multilayer board in a particular way with respect to each other to guide the re-radiated beam in a particular direction. For example, the EHF focusing layers may be arranged such that a vertical wall exists on one side of the cavity backed reflective lens and a slanted wall exists on an opposite side of the cavity backed reflective lens. The two adjacent sides may be vertical or slanted. The transducer can be placed anywhere with respect to the cavity backed reflective lens. The position of the transducer and the arrangement of the EHF focusing layers steer an electromagnetic (EM) signal energy being re-radiated by the beam steering cavity backed reflective lens along an axis that is oblique to a center axis that is perpendicular to the multilayer board.

Unwanted side lobes can be caused by a variety of reasons. As shown in connection with CBR lens 650, unwanted side lobes may have resulted due to fact that virtually no paraboloid exists within the cavity. Another cause of side lobes may occur when an abrupt conducting edge or corner is in close proximity of an antenna, as the edge or corner tends to re-radiate the RF energy. The EHF radio waves will re-radiate in the same manner as light wave and optical scattering and diffraction principals apply. Some amount of re-radiation will occur and this is in the form of unwanted side lobes to the antenna radiation pattern. To minimize the re-radiation, one must either limit the impinging on an abrupt edge or arrange the edges such that that there are symmetrical edges with an appropriate orientation and spacing that the re-radiated energy undergoes destructive interference as the energy propagates away from the antenna structure. This has the effect to canceling out or nulling the re-radiated energy. A combination of both methods can be used. Once an approximate series of apertures and/or lenses is selected, an electromagnetic simulator (e.g., HFSS) can be used to iterate over several geometric variables (size, spacing etc.) to maximize the desired gain and radiation pattern with an acceptable level of sidelobes.

Figure 11:
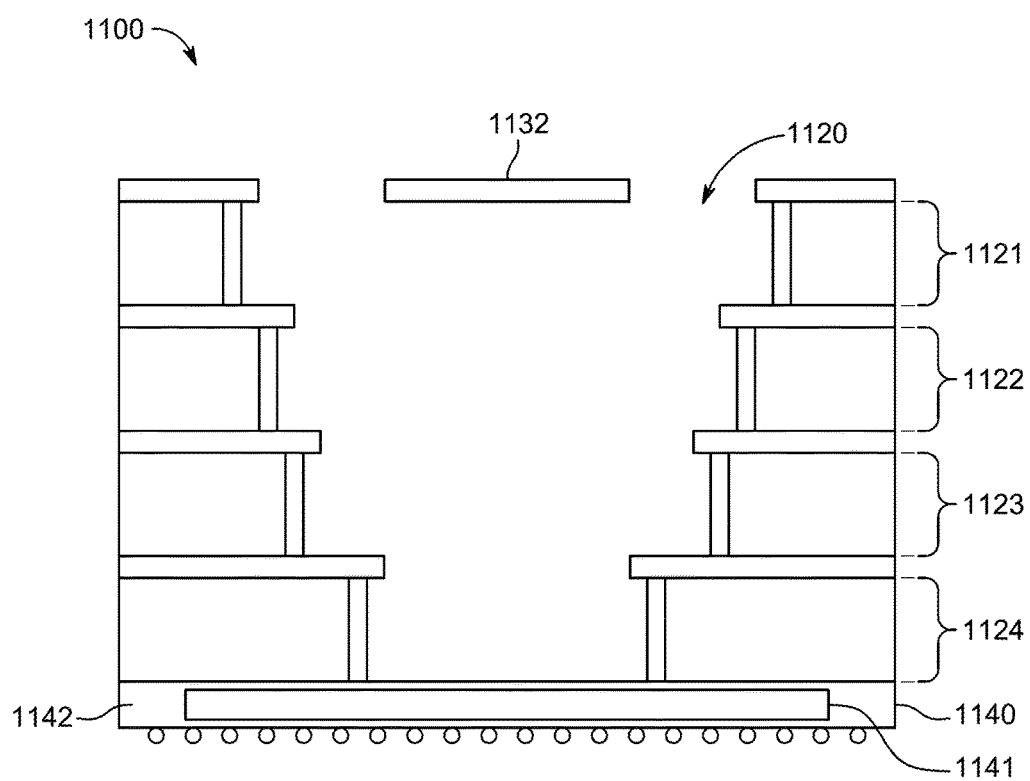
FIG. 11 shows illustrative cross-sectional view of a module according to an embodiment.

FIG. 11 shows illustrative cross-sectional view of module 1100 according to an embodiment. Module 1100 has reflective lens 1120 mounted directly on top of the die of CCU control circuitry package 1140. Package 1140 can include die 1141 that is surrounded by insulation layer 1142. Die 1141 may serve as the nominal reflecting ground plane for reflective lens 1120. Alternatively, in addition to the die, some type of metal, reflective material or redirective materials can be placed on the die or above the die, but within insulation layer 1142, to serve as a reflective ground plane. Reflective lens 1120 can include EHF focusing layers 1121-1124, where the EHF focusing window of each layer can have a different cross-sectional area. CCU antenna 1132 may be positioned at or near the top of reflective lens 1120, through it should be understood that antenna 1132 may be placed anywhere within reflective lens 1120 or it can be placed on the die of the CCU or within the insulation layer 1142 but above die 1141.

Figure 12:
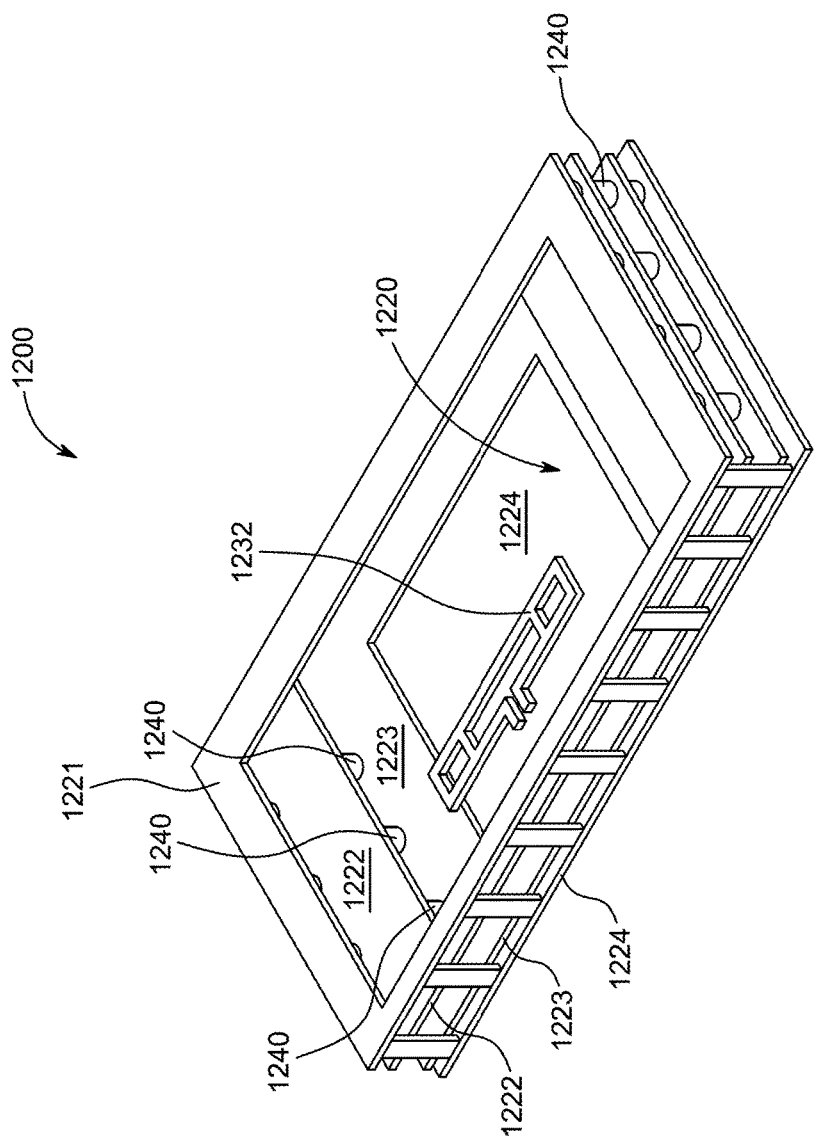
FIG. 12 show illustrative perspective views of a module according to an embodiment.

FIG. 12 shows illustrative perspective views of module 1200 according to an embodiment. Module 1200 has four EHF focusing layers 1221, 1222, 1223, and 1224, CCU antenna 1232, and vias 1240. Each EHF focusing layer includes a conductive layer that is connected to one or more vias 1240. Vias 1240 electrically couple the conductive layers located in adjacent EHF focusing layers. Module 1200 also shows cavity backed reflective lens 1220, which resembles a paraboloid shaped cavity existing under antenna 1332. Cavity backed reflective lens 1220 may be filled with a non-conducting dielectric material such as, for example, Barium titanate. The paraboloid is formed by decreasing window sizes in layers 1221-1223, where the window in layer 1221 represents the large sized aperture, the window in layer 1222 represents a medium sized aperture (that is smaller than the large aperture), and the window in layer 1223 represents a small sized aperture (that is smaller than the medium size). Layer 1224 can form the floor or reflective ground plane of cavity backed reflective lens 1220. Cavity backed reflective lens 1220 can exist entirely within the four EHF focusing layers, thereby serving as an intra-board EM focusing lens.

The cavity backed reflective lens according to embodiments discussed herein can be used with many different type of antennas, antennas other than dipole or folded dipole. For example, a patch antenna or a fan dipole antenna can be used. As another example, a loop or slot antenna can be used. As yet another example, a Yagi or loop "quad" antenna can be used.

Figure 13A:
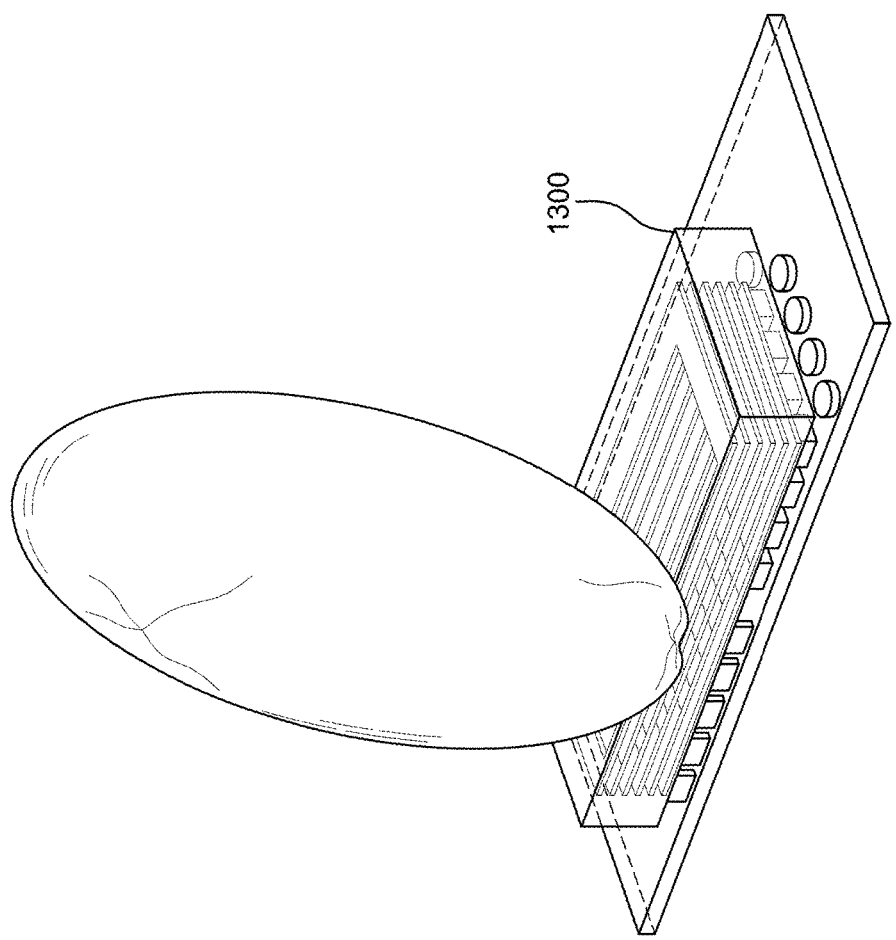
FIG. 13A shows an illustrative view of a module according to an embodiment.
Figure 13B:
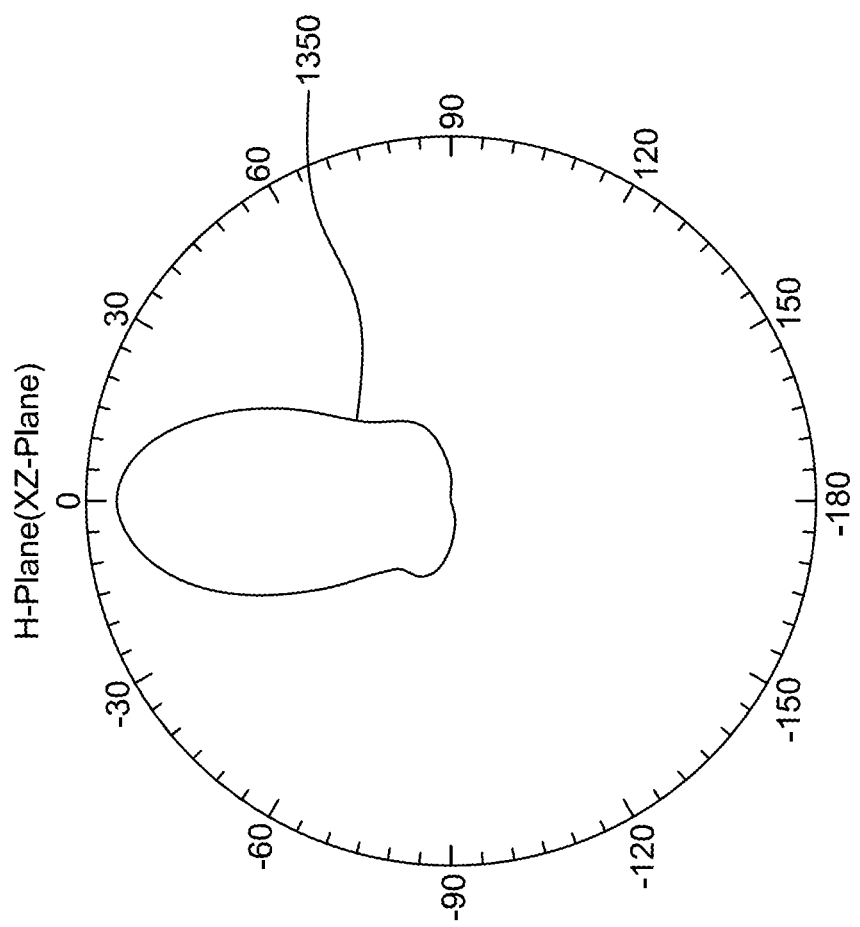
FIG. 13B shows an RF energy pattern, according to an embodiment.

FIG. 13A shows an illustrative view of module 1300 according to an embodiment. Module 1300 represents cavity backed reflective lens that is not limited by the maximum thickness limitation of the substrate in which the lens resides. As a result, the CBR can be optimized for greater gain and directivity. Module 1300 can be constructed with four, five, or more apertures to allow for construction of a stepped parabolic-shaped surface within the cavity that more closely emulates a conventional parabolic reflector antenna. Module 1300 may produce an RF energy pattern similar to that shown in FIG. 13B, which shows lobe 1350 emanating in the positive Z direction.

Figure 14A:
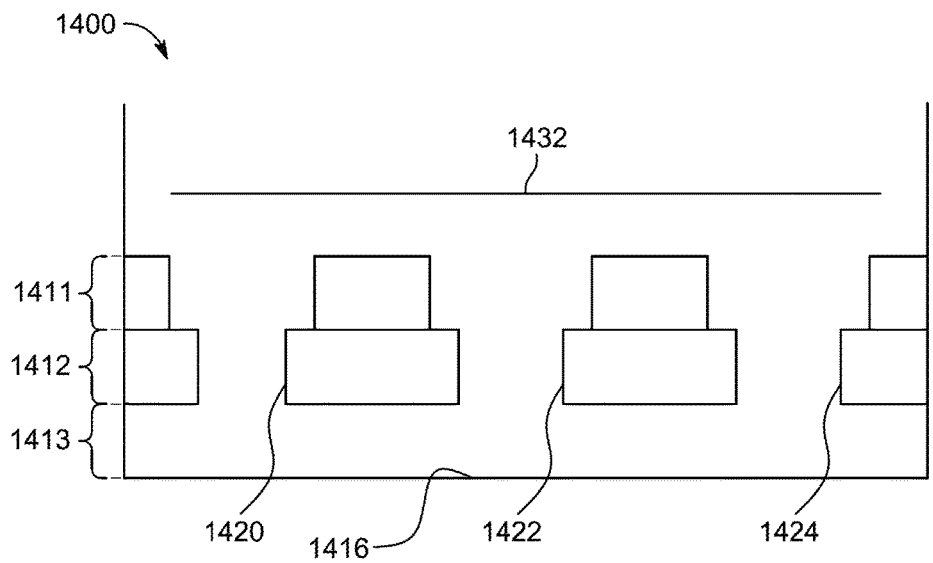
FIGS. 14A and 14B show illustrative cross-sectional views of module having multiple CBRs according to various embodiments.

FIG. 14A shows an illustrative cross-sectional view of module 1400 having multiple CBRs according to an embodiment. Module 1400 includes multiple CBRs arranged in an N×M matrix, where N is an integer of one or higher and M is an integer of two or higher. As shown, module 1400 includes a 1×3 arrangement of CBRs 1420, 1422, and 1424 formed within EHF focusing layers 1411-1413, with layer 1416 representing the ground layer. Antenna 1432 may positioned above layer 1411 or be co-planar with layer 1411. In this arrangement, each of CBRs 1420, 1422, and 1424 may re-radiate in a manner similar to a Yagi reflector element.

Figure 14B:
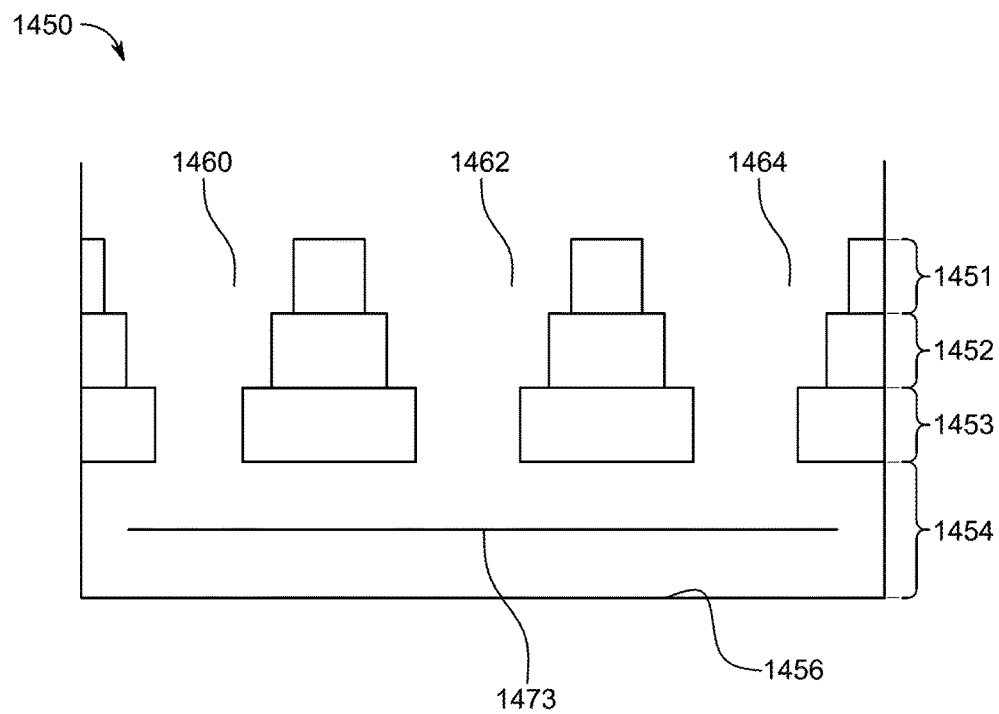

FIG. 14B shows an illustrative cross-sectional view of module 1450 having multiple CBRs according to an embodiment. Module 1400 includes multiple CBRs arranged in an N×M matrix, where N is an integer of one or higher and M is an integer of two or higher. As shown, module 1450 includes a 1×3 arrangement of CBRs 1460, 1462, and 1464 formed within EHF focusing layers 1451-1454, with layer 1456 representing the ground layer. Antenna 1472 may positioned within layer 1454 such that apertures 1460, 1462, and 1464 are positioned in front of antenna 1472. In this arrangement, module 1450 more closely resembles a Yagi antenna.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Moreover, any processes described with respect to FIGS. 1-14B, as well as any other aspects of the invention, may each be implemented by software, but may also be implemented in hardware, firmware, or any combination of software, hardware, and firmware. They each may also be embodied as machine- or computer-readable code recorded on a machine- or computer-readable medium. The computer-readable medium may be any data storage device that can store data or instructions which can thereafter be read by a computer system. Examples of the computer-readable medium may include, but are not limited to, read-only memory, random-access memory, flash memory, CD-ROMs, DVDs, magnetic tape, and optical data storage devices. The computer-readable medium can also be distributed over network-coupled computer systems so that the computer readable code is stored and executed in a distributed fashion. For example, the computer-readable medium may be communicated from one electronic subsystem or device to another electronic subsystem or device using any suitable communications protocol. The computer-readable medium may embody computer-readable code, instructions, data structures, program modules, or other data in a modulated data signal, such as a carrier wave or other transport mechanism, and may include any information delivery media. A modulated data signal may be a signal that has one or more of its characteristics set or changed in such a manner as to encode information in the signal.

It is to be understood that any or each module or state machine discussed herein may be provided as a software construct, firmware construct, one or more hardware components, or a combination thereof. For example, any one or more of the state machines or modules may be described in the general context of computer-executable instructions, such as program modules, that may be executed by one or more computers or other devices. Generally, a program module may include one or more routines, programs, objects, components, and/or data structures that may perform one or more particular tasks or that may implement one or more particular abstract data types. It is also to be understood that the number, configuration, functionality, and interconnection of the modules or state machines are merely illustrative, and that the number, configuration, functionality, and interconnection of existing modules may be modified or omitted, additional modules may be added, and the interconnection of certain modules may be altered.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A system, comprising:
   a multi-layer substrate comprising a plurality of EHF focusing layers that collectively form a cavity backed reflective lens characterized as having a cavity that enhances constructive interference of electromagnetic (EM) signal energy being re-radiated by the cavity backed reflective lens and narrows a shape of the EM signal being directed away from the cavity backed reflective lens, wherein each of the EHF focusing layers comprises:
   a dielectric portion that forms part of an EHF focusing window through which the EM signal passes through; and
   a plurality of conductive portions that form a periphery of the EHF focusing window, wherein the EHF focusing window of each EHF focusing layer is characterized by a different cross-sectional area that collectively defines a beam shaping geometry of the cavity backed reflective lens that enhances the constructive interference of electromagnetic (EM) signal energy; and
   a contactless communication unit (CCU) comprising control circuitry and an antenna, wherein the antenna is positioned with respect to the cavity backed reflective lens, and wherein during operation of the CCU, an electromagnetic signal pattern being emitted from or received by the antenna is shaped by the cavity backed reflective lens.

2. The system of claim 1, wherein the cross-sectional area of the EHF focusing window in a top one of the EHF focusing layers is greater than the EHF focusing window in a EHF focusing layer located below the top EHF focusing layer, and wherein the cross-sectional areas of the EHF focusing windows are dimensioned such that the cavity resembles a paraboloid.

3. The system of claim 1, wherein the plurality of conductive portion comprises conductive vias and a conductive layer, wherein the conductive vias surround the dielectric portion to define a cross-sectional area of the EHF focusing window.

4. The system of claim 1, wherein a bottom one of the EHF focusing layers comprises a nominal reflecting ground layer.

5. The system of claim 4, wherein a distance between the antenna and the nominal reflecting ground layer is less than ¼ of a wavelength of the EM signal.

6. The system of claim 1, wherein a thickness of the multi-layer substrate is about 1 millimeter or less.

7. The system of claim 1, wherein the EM signal energy is being re-radiated by a combination of the cavity backed reflective lens and constructive interference provided by at least one intermediate EHF focusing layer, wherein the at least one intermediate EHF focusing layer exist between a top EHF focusing layer and a bottom EHF focusing layer.

8. A module for controlling contactless communications with a counterpart communications unit, the module comprising:
   contactless communications circuitry comprising silicon die and an insulation layer encompassing the silicon die, the circuitry comprising a first surface;
   an antenna that is electrically coupled to the contactless communications circuitry; and
   an EM focusing structure secured to the first surface, the EM focusing structure comprising a plurality of EHF focusing layers that collectively form a cavity backed reflective lens, wherein the silicon die serves as a nominal reflective ground plane for the EM focusing structure, and wherein each of the EHF focusing layers is characterized by a different cross-sectional area such that the EHF focusing layers collectively define a beam shaping geometry of the cavity backed reflective lens.

9. The module of claim 8, further comprising a reflective material that is disposed on top of the silicon die, wherein the combination of the reflective material and the silicon die serves as the nominal reflective ground plane for the EM focusing structure.

10. The module of claim 8, wherein the antenna is positioned a position located between a top surface of the EM focusing structure and the silicon die.

11. The module of claim 8, wherein each of the plurality of EHF focusing layers comprises an EHF focusing window, wherein the EHF focusing window comprises a dielectric portion that is framed by a conductive portion, wherein the plurality of EHF focusing layers comprises first, second, and third EHF focusing layers, and wherein the first EHF focusing layer is positioned directly to the silicon die, the second EHF focusing layer is positioned on top of the first EHF focusing layer, and the third EHF focusing layer is positioned on top of the second EHF focusing layer.

12. The module of claim 11, wherein the EHF focusing window associated with the first EHF focusing layer has a smaller cross-section than the EHF focusing window associated with the second EHF focusing layer, and wherein the EHF focusing window associated with the second EHF focusing layer has a smaller cross-section than the EHF focusing window associated with the third EHF focusing layer.

13. The module of claim 8, wherein during operation of the contactless communication circuitry, an EM signal being emitted from or received by the antenna is re-radiated and focused by the cavity backed reflective lens.

14. An EM reflective lens for use in focusing EM signal energy being emitted by or received by an antenna for contactless communications, the EM reflective lens comprising:
- a nominal reflecting ground plane;
- a first EHF focusing layer positioned on top of the nominal reflecting ground plane, the first EHF focusing layer comprising a first EHF focusing window having a first cross-sectional area;
- a second EHF focusing layer positioned on top of the first EHF focusing layer, the second EHF focusing layer comprising a second EHF focusing window having a second cross-sectional area that is greater than the first cross-sectional area;
- a third EHF focusing layer positioned on top of the second EHF focusing layer, the third EHF focusing layer comprising a third EHF focusing window having a third cross-sectional area that is greater than the second cross-sectional area; and
- wherein the first, second, and third EHF focusing windows define a cavity backed reflective lens characterized as having a cavity shaped as a paraboloid.

15. The EM reflective lens of claim 14, wherein the antenna is positioned above the first EHF focusing window.

16. The EM reflective lens of claim 14, wherein the first, second, and third EHF focusing layers each comprise dielectric portions and conductive portions, wherein the dielectric portions are EM signal transmissive and the conductive portions are EM signal blocking.

17. The EM reflective lens of claim 14 further comprising a center axis associated with the first, second, and third EHF focusing layers, and wherein the antenna is positioned offset with respect to the center axis to steer the EM signal energy oblique to the center axis.

18. A device comprising:
- a multilayer board comprising a plurality of EHF focusing layers embedded within the multilayer board, wherein the plurality of EHF focusing layers are arranged with respect to each other to provide a beam steering cavity backed reflective lens, and wherein each of the EHF focusing layers is characterized by a different cross-sectional area such that the EHF focusing layers collectively define a beam shaping geometry of the cavity backed reflective lens; and
- a transducer positioned with respect to the beam steering cavity backed reflective lens, wherein the position of the transducer and the arrangement of the EHF focusing layers steer an electromagnetic (EM) signal energy being re-radiated by the beam steering cavity backed reflective lens along an axis that is oblique to a center axis that is perpendicular to the multilayer board.

* * * * *

UNITED STATES PATENT AND TRADEMARK OFFICE
CERTIFICATE OF CORRECTION

| | |
|---|---|
| PATENT NO. | : 10,374,320 B2 |
| APPLICATION NO. | : 15/206583 |
| DATED | : August 6, 2019 |
| INVENTOR(S) | : Rosenauer et al. |

It is certified that error appears in the above-identified patent and that said Letters Patent is hereby corrected as shown below:

In the Specification

In Column 1, Line 22, delete "(RE)" and insert -- (RF) --, therefor.

In Column 3, Line 2, delete "embodiment; and" and insert -- embodiment; --, therefor.

In Column 3, Line 33, delete "embodiments;" and insert -- embodiments. --, therefor.

In Column 13, Line 24, delete "min" and insert -- mm --, therefor.

In Column 19, Line 13, delete "sidelobes." and insert -- side lobes. --, therefor.

In the Claims

In Column 21, Claim 1, Line 44, delete "signal" and insert -- signal energy --, therefor.

In Column 21, Claim 1, Line 48, delete "signal" and insert -- signal energy --, therefor.

In Column 21, Claim 1, Line 60, delete "an" and insert -- the --, therefor.

In Column 21, Claim 1, Line 61, delete "pattern" and insert -- energy --, therefor.

In Column 21, Claim 2, Line 65, delete "one of the".

In Column 22, Claim 2, Line 1, delete "areas" and insert -- area of each --, therefor.

In Column 22, Claim 3, Line 5, delete "portion" and insert -- portions --, therefor.

In Column 22, Claim 5, Line 14, delete "signal" and insert -- signal energy --, therefor.

Signed and Sealed this
Twelfth Day of May, 2020

Andrei Iancu
*Director of the United States Patent and Trademark Office*

CERTIFICATE OF CORRECTION (continued)
U.S. Pat. No. 10,374,320 B2

In Column 22, Claim 9, Line 42, delete "the" and insert -- a --, therefor.

In Column 22, Claim 13, Line 67, delete "communication" and insert -- communications --, therefor.

In Column 24, Claim 17, Line 4, delete "claim 14" and insert -- claim 14, --, therefor.